United States Patent [19]

Merrill et al.

[11] Patent Number: 5,296,409

[45] Date of Patent: Mar. 22, 1994

[54] METHOD OF MAKING N-CHANNEL AND P-CHANNEL JUNCTION FIELD-EFFECT TRANSISTORS AND CMOS TRANSISTORS USING A CMOS OR BIPOLAR/CMOS PROCESS

[75] Inventors: Richard B. Merrill, Daly City; Doug R. Farrenkopf, Santa Clara, both of Calif.

[73] Assignee: National Semiconductor Corporation, Calif.

[21] Appl. No.: 880,677

[22] Filed: May 8, 1992

[51] Int. Cl.⁵ .......................................... H01L 21/265
[52] U.S. Cl. .................................. 437/34; 437/56; 437/59
[58] Field of Search ..................... 437/34, 56, 59

[56] References Cited

U.S. PATENT DOCUMENTS

| | | | |
|---|---|---|---|
| 4,325,180 | 4/1982 | Curran | 437/56 |
| 4,373,253 | 2/1983 | Khadder et al. | 437/74 |
| 4,403,395 | 9/1983 | Curran | 437/55 |

*Primary Examiner*—Olik Chaudhuri
*Assistant Examiner*—Long Pham
*Attorney, Agent, or Firm*—Limbach & Limbach

[57] ABSTRACT

A method of making N-channel and P-channel junction field-effect transistors using a modified CMOS process that simultaneously makes complementary metal-oxide-semiconductor transistors, or a modified BiCMOS process that simultaneously makes bipolar transistors and complementary metal-oxide-semiconductor transistors. Making junction field effect transistors using the basic CMOS process requires mask changes and an additional mask, etch, and implant step. Making junction field effect transistors using the BiCMOS process only requires mask changes.

34 Claims, 12 Drawing Sheets

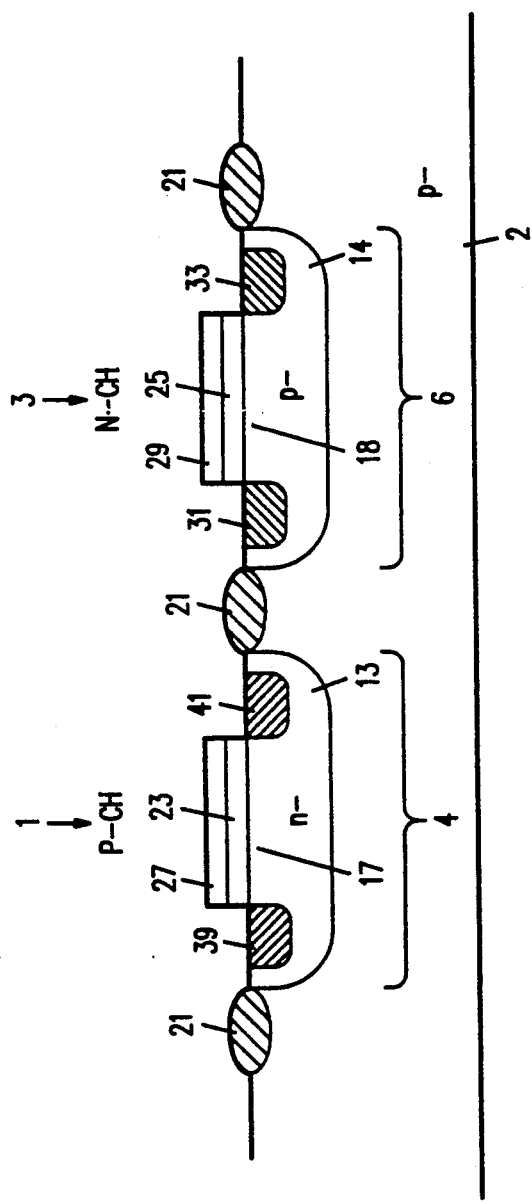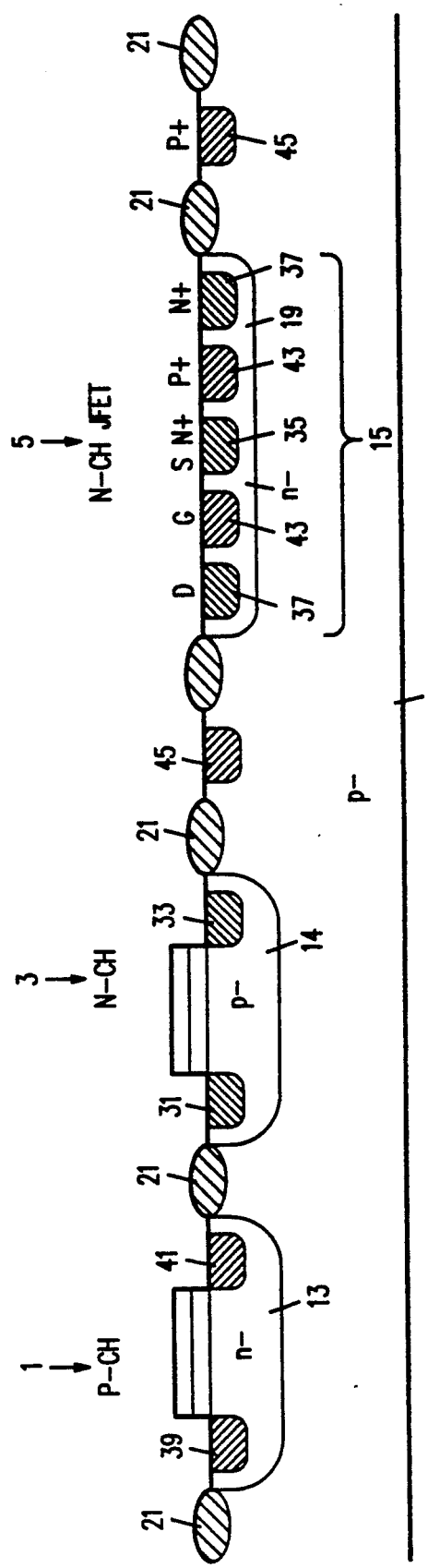

METHOD OF MAKING N-CHANNEL AND P-CHANNEL JUNCTION FIELD-EFFECT TRANSISTORS AND CMOS TRANSISTORS USING A CMOS OR BIPOLAR/CMOS PROCESS

BACKGROUND OF THE INVENTION

The trend in integrated circuits to ever larger scales of integration has led to analog and digital circuits being combined on the same silicon substrate. Circuits such as analog to digital converters and digital to analog circuits combine precision analog stages with complex digital circuits. The analog stages of such circuits must have low input offset voltage, low input offset voltage drift over time, low input current, low noise, and high gain.

Conventional approaches to making combined analog and digital circuits use complementary metal-oxide-semiconductors (CMOS) transistors for both the analog stages and the digital stages of the circuit. However, the performance of the analog stages of such circuits has not been satisfactory. Even though such stages have had extremely low input current and acceptable gain, and can be trimmed to have an acceptably low input offset voltage, they have an unacceptably high input offset voltage drift over time.

Metal-oxide-semiconductor (MOS) transistors made using a normal digital CMOS process have a considerable variation in threshold voltage, which determines the input offset voltage of the analog stage in which the transistors are used. Such threshold voltage variations are of no consequence when MOS transistors used in digital circuits. Moreover, the input stages of analog stages made using MOS transistors can be trimmed to reduce the offset voltage to an acceptable level. However, trimming the input offset voltage is to no avail, since the threshold voltage of MOS transistors made using a normal digital CMOS process is unstable. Thus, if an input stage is trimmed to reduce its input offset voltage, the input offset voltage can reappear some time later due to the instability of the threshold voltages of the MOS transistors forming the input stage. Threshold voltage changes of over 60 mV have been observed.

Threshold voltage instability is mainly due to unstable surface states in the silicon-silicon dioxide interface under the gate of the MOS input transistors. Other mechanisms causing threshold voltage instability include unstable states within the gate oxide, and mobile ion drift.

Threshold voltage instability is particularly severe if the circuit is subject to high levels of radiation. High density CMOS circuits that have geometries of less than 1 micron are usually manufactured using a process that includes plasma etching. Plasma etching subjects the circuit to high levels of radiation, and the MOS transistors forming the analog input stages of the circuit consequently suffer from threshold voltage instability. MOS input transistors can also be subject to high levels of radiation if the circuit is operated in an environment in which there are high levels of radiation.

The same mechanism that causes threshold voltage instability also causes analog stages made using CMOS transistors to have a higher than desirable noise level.

Thus, MOS transistors made using a CMOS process have drawbacks that make them unsuitable for use in precision analog stages.

A few steps can be added to a basic CMOS fabrication process to allow bipolar transistors to be made on the same semiconductor substrate as digital CMOS transistors. Bipolar transistors made in such a process have stable and well-matched $V_{be}$ and current gain. This enables such bipolar transistors to be used as the input stage of a precision analog stage. However, analog stages using bipolar input transistors have a significant input current, which renders them less than ideal.

SUMMARY OF THE INVENTION

The invention relates to processes that enable junction field-effect transistors (JFETs) to be made using processes that primarily make CMOS transistors. According to the invention, the basic process that makes CMOS transistors only requires mask changes and an additional mask and implant step to make a P-channel JFET or an N-channel JFET. To make both a P-channel JFET and an N-channel JFET, mask changes and two additional mask and etch steps are required. According to the invention, the process that makes bipolar+CMOS transistors, the so-called BiCMOS process, requires mask changes, but no additional steps, to make a P-channel JFET, an N-channel JFET, or both.

The channel of a JFET is formed in the bulk material of device. Changes in the silicon-silicon dioxide interface at the surface of the device consequently have a relatively small influence on threshold voltage, which depends on conduction within the channel. Consequently, JFETs have well-matched and stable threshold voltages. The input current of a JFET is several orders of magnitude less than the input current of a bipolar transistor. Amplifiers with JFET input stages have low input offset voltage, low input offset voltage drift over time, low input current, high gain, and low noise.

In a method according to a first aspect of the invention the elements of an N-channel junction field-effect transistor (JFET) are fabricated while simultaneously fabricating the elements of a first metal-oxide-semiconductor (MOS) transistor and a second metal-oxide-semiconductor (MOS) transistor. The second MOS transistor has a channel conductivity of the opposite type to the first MOS transistor.

In the first step of the method according to the first aspect of the invention, a substrate of a semiconductor material having a conductivity of a first type is provided. The substrate includes a first part that forms the channel region of the second MOS transistor. The substrate also includes a second part that includes a MOS channel well region of a second conductivity type, opposite to the first conductivity type. The MOST channel well regin forms the channel region of the first MOS transistor.

In the second step, an impurity is introduced into first selected regions in the first part of the substrate to form the source and drain of the second MOS transistor. The impurity is simultaneously introduced into a second selected region and a third selected region in the first part of the substrate to form the source and drain, respectively, of the JFET. The impurity causes the first selected regions, the second selected region, and the third selected region to be of the second conductivity type.

In the third step, an impurity is introduced into a fourth selected region, substantially bounded by the third selected region, to form the channel region of the JFET. The impurity causes the fourth selected region to be of the second conductivity type.

In the last step, an impurity is introduced into fifth selected regions in the MOS channel well region to form the source and drain of the first MOS transistor. The impurity is simultaneously introduced into a sixth selected region between the second selected region and the third selected region to form the gate of the JFET. The impurity causes the fifth selected regions and the sixth selected region to be of the first conductivity type.

In a method according to a second aspect of the invention, the elements of a P-channel junction field-effect transistor (JFET) are fabricated while simultaneously fabricating the elements of a first metal-oxide-semiconductor (MOS) transistor and a second metal-oxide-semiconductor (MOS) transistor. The second MOS transistor has a channel conductivity of the opposite type to the first MOS transistor.

In the first step of the method according to the second aspect of the invention, a substrate of a semiconductor material having a conductivity of a first type is provided. The substrate includes a first part that forms the channel region of the second MOS transistor, and a second part.

In the second step, an impurity is introduced into an MOS channel well region in the second part of the substrate to form the channel region of the first MOS transistor. The impurity is simultaneously introduced into a JFET well region in the second part of the substrate to form the back gate of the JFET. The impurity causes the MOS channel well region and the JFET well region to be of a second conductivity type. The second conductivity type is opposite to the first conductivity type.

In the third step, an impurity is introduced into first selected regions in the first part of the substrate to form the source and drain of the second MOS transistor. The impurity is simultaneously introduced into a second selected region in the JFET well region to form the gate of the JFET. The impurity causes the first selected regions and the second selected region to be of the second conductivity type.

In the fourth step, an impurity is introduced into a third selected region outside the second selected region in the JFET well region to form the channel region of the JFET. The impurity causes the third selected region to be of the first conductivity type.

In the last step, an impurity is introduced into fourth selected regions in the MOS channel well region to form the source and drain of the first MOS transistor. The impurity is simultaneously introduced into a fifth selected region and a sixth selected region adjacent to the second selected region within the third selected region to form the source and drain, respectively, of the JFET. The impurity causes the fourth selected regions, the fifth selected region, and the sixth selected region to be of the first conductivity type.

In a method according to a third aspect of the invention, the elements of an N-channel junction field-effect transistor (JFET) are fabricated while simultaneously fabricating the elements of a first metal-oxide-semiconductor (MOS) transistor, a second metal-oxide-semiconductor (MOS) transistor, and a bipolar transistor. The second MOS transistor has a channel conductivity of the opposite type to the first MOS transistor.

In the first step of the method according to the third aspect of the invention, a substrate of a semiconductor material having a conductivity of a first type is provided. Formed in the substrate below the surface of the substrate are a buried layer of the first conductivity type and a buried layer of a second conductivity type. The second conductivity type is opposite to the first conductivity type.

In the second step, an impurity is introduced into a collector well region of the substrate above the buried layer of the second conductivity type to form the collector of the bipolar transistor. The impurity is simultaneously introduced into a first MOS channel well region of the substrate to form the channel region of the first MOS transistor. The impurity is also simultaneously introduced into a JFET well region of the substrate above the buried layer of the first conductivity type to form the channel region of the JFET. The impurity causes the collector well region, the first MOS channel well region, and the JFET well region to be of the second conductivity type.

In the third step, an impurity is introduced into a second MOS channel well region of the substrate to form the channel region of the second MOS transistor. The impurity is simultaneously introduced into a first selected region within the collector well region to form the base of the bipolar transistor. The impurity causes the second MOS channel well region and the first selected region to be of the first conductivity type.

In the fourth step, an impurity is introduced into a second selected region and into a third selected region in the JFET well region to form the source and drain, respectively, of the JFET. The impurity is simultaneously introduced into fourth selected regions in the second MOS channel well region to form the source and drain of the second MOS transistor. The impurity is also simultaneously introduced into a fifth selected region within the first selected region to form the emitter of the bipolar transistor. The impurity causes the second selected region, the third selected region, the fourth selected regions and the fifth selected region to be of the second conductivity type.

In the last step, an impurity is introduced into sixth selected regions in the first MOS channel well region to form the source and drain of the first MOS transistor. The impurity is simultaneously introduced into a seventh selected region between the second selected region and the third selected region to form the gate of the JFET. The impurity causes the sixth selected regions and the seventh selected region to be of the first conductivity type.

In a method according to a fourth aspect of the invention, the elements of a P-channel junction field-effect transistor (JFET) are fabricated while simultaneously fabricating the elements of a first metal-oxide-semiconductor (MOS) transistor, a second metal-oxide-semiconductor (MOS) transistor, and a bipolar transistor. The first MOS transistor has a channel conductivity of the opposite type to the first MOS transistor.

In the first step of the method according to the fourth aspect of the invention, a substrate of a semiconductor material having a conductivity of a first type is provided. Formed in the substrate below the surface of the substrate are a first buried layer of a second conductivity type, opposite to the first conductivity type, and a second buried layer of the second conductivity type. At least part of the second buried layer forms the back gate of the junction field-effect transistor. Formed in the substrate above the first buried layer of the second conductivity type is a collector well region of the second conductivity type. The collector well forms the collector of the bipolar transistor. Also formed in the substrate is a first MOS channel well region of the second conductivity type. The first MOS channel well forms the channel region of the first MOS transistor.

In the second step, an impurity is introduced into a JFET well region of the substrate above the second buried layer of the second conductivity type. The JFET well region forms the channel region of the junction field-effect transistor. The impurity is simultaneously introduced into a second MOS channel well region of the substrate to form the channel region of the second MOS transistor. The impurity is also simultaneously introduced into a first selected region within the collector well region to form the base of the junction transistor. The impurity causes the JFET well region, the second MOS channel well region, and the first selected region to be of the first conductivity type.

In the third step, an impurity is introduced into a second selected region in the JFET well region to form the top gate of the JFET. The impurity is simultaneously introduced into third selected regions in the second MOS channel well region to form the source and drain of the second MOS transistor. The impurity is also simultaneously introduced into a fourth selected region within the first selected region to form the emitter of the bipolar transistor. The impurity causes the second selected region, the third selected regions, and the fourth selected region to be of the second conductivity type.

In the last step, an impurity is introduced into fifth selected regions in the first MOS channel well region to form the source and drain of the first MOS transistor. The impurity is simultaneously introduced into a sixth selected region and a seventh selected region adjacent to the second selected region to form the source and drain, respectively, of the JFET. The impurity causes the fifth selected regions, the sixth selected region, and the seventh selected region to be of the first conductivity type.

DETAILED DESCRIPTION OF THE DRAWINGS

FIG. 2 is a cross sectional view of an integrated circuit device structure including an N-channel MOS transistor and a P-channel MOS transistor, made by the basic CMOS process of FIG. 1A.

FIG. 3 is a cross sectional view of an integrated circuit device structure including an N-channel MOS transistor, a P-channel MOS transistor, and an N-channel JFET, made by the modified CMOS process of FIG. 1B.

DETAILED DESCRIPTION OF THE INVENTION

A. Making JFETs using a Basic CMOS Process

1. The Basic CMOS Process

Figure 1A:
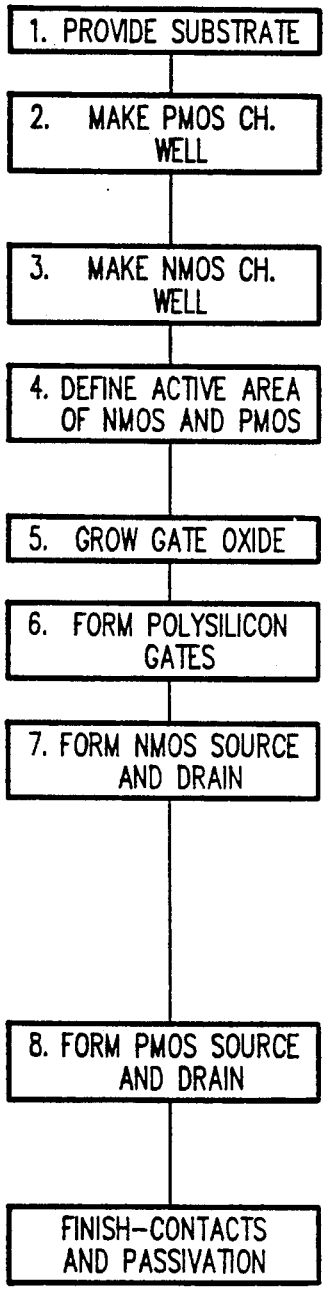
FIG. 1A is a flow chart showing the steps of a typical basic CMOS process.

So that the methods according to the invention can be better appreciated, a typical basic CMOS process for making an N-channel MOS transistor and a P-channel MOS transistor in the same semiconductor substrate will first be described. The basic CMOS process flow is illustrated in FIG. 1A. A cross section of an integrated circuit device structure made by the basic CMOS process is shown in FIG. 2. FIG. 2 shows the P-channel MOS transistor 1 and the N-channel MOS transistor 3.

In the first step of the process, a substrate 2 of a semiconductor material, preferably silicon, lightly doped with a P-type impurity such as boron is provided.

In the second step, a channel well 13 is defined using a conventional mask and etch process, and an impurity such as phosphorus is introduced deep into this area using a conventional implantation or diffusion technique. The impurity converts the channel well 13 into a relatively lightly doped N-type region. The channel well 13 provides the channel region 17 of the P-channel MOS transistor 1.

In the third step of the basic process, a well region 14 is defined using a conventional mask and etch process, and an impurity such as boron is introduced into this area using a conventional implantation or diffusion technique. The impurity increases the conductivity of the P-type material of the substrate 2. The well region 14 provides the channel region 18 of the N-channel MOS transistor 3. Optionally, this step may be omitted and the substrate 2 may provide the channel region of the N-channel MOS transistor 3.

In the fourth step of the basic process, a layer of field oxide 21 is grown on the substrate 2. The field oxide is etched using a conventional mask and etch process to define the active regions 4 and 6 of the P-channel MOS transistor 1 and the N-channel MOS transistor 3, respectively.

In the fifth step, a layer of gate oxide, including the parts marked 23 and 25, is grown over the active areas of the P-channel MOS transistor 1 and the N-channel MOS transistor 3.

In the sixth step, a layer of polysilicon is deposited over the entire area of the substrate 2, doped, and etched, using a standard mask and etch process, to provide the gates 27 and 29 of the P-channel MOS transistor 1 and the N-channel MOS transistor 3, respectively.

In the seventh step, the layer of gate oxide is etched to define the source 31 and the drain 33 of the N-channel MOS transistor 3, using a standard mask and etch process. An N-type impurity such as arsenic is introduced into the source 31 and the drain 33 using a conventional implantation or diffusion technique. The impurity converts the source 31 and the drain 33 into relatively heavily doped N+ regions. Using the gate oxide to define the source 31 and the drain 33 ensures that the source and drain are correctly aligned with the gate 29.

In the eighth step of the basic process, the gate oxide is etched to define the source 39 and the drain 41 in the channel well 13 of the P-channel MOS transistor 1, using a conventional mask and etch process. A P-type impurity such as boron is introduced into the source 39 and the drain 41 using a conventional implantation or diffusion technique. The impurity converts the source 39 and the drain 41 into relatively heavily doped P+ regions. Using the gate oxide to define the source 39 and the drain 41 ensures that the source and drain are correctly aligned with the gate 27.

The basic process is completed by a finishing step that provides metallic contacts (not shown) to the various electrodes of the transistors, and provides a passivation layer (not shown).

A variety of specific fabrication mechanisms can be used to carry out the steps of the method described above, and to carry out the steps of the methods to be described below.

2. Making an N-Channel JFET using the Basic CMOS Process

Figure 1B:
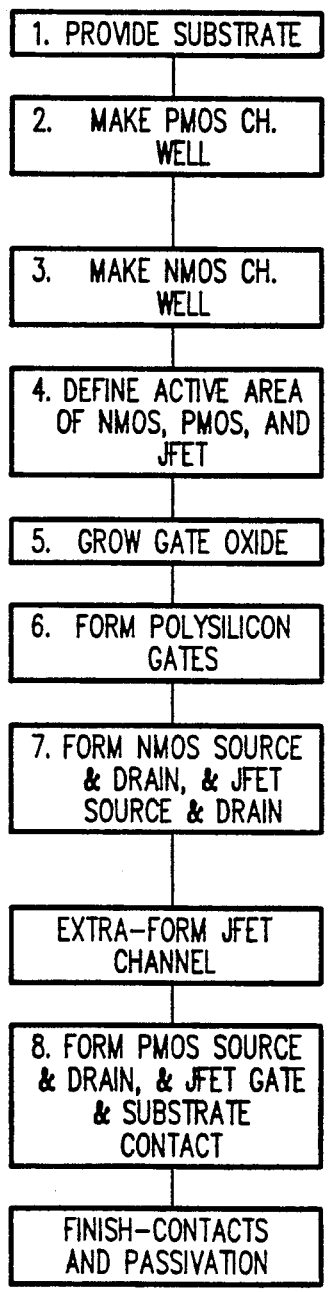
FIG. 1B is a flow chart showing the steps of the CMOS process modified to make an N-channel JFET.

The CMOS process modified according to the first aspect of the invention to also make N-channel JFETs is shown in FIG. 1B. A cross section of an integrated circuit device made by the N-channel JFET modified CMOS process of FIG. 1B is shown in FIG. 3. FIG. 3 shows the P-channel MOS transistor 1, the N-channel MOS transistor 3, and the N-channel JFET 5.

In the process of making an N-channel JFET using a modified CMOS process according to the invention, the first seven steps and the finishing step of the basic CMOS process are used unchanged. Mask changes are required in several of the steps of the process to define the elements of the JFET made simultaneously with the elements of the N-channel and P-channel MOS transistors in each step of the process. An additional step is added to the basic CMOS process to provide the channel of the JFET.

No mask is used in the first step of the process.

The second and third steps of the process are concerned only with making the MOS transistors 1 and 3, and so are the same as in the basic CMOS process.

The mask for the fourth step of the process is modified to define the active area 15 of the JFET 5. Field oxide is then removed from the active area 15 by the same etching process that removes the field oxide from the active areas of the MOS transistors 1 and 3.

The fifth and sixth steps of the process are concerned only with making the MOS transistors 1 and 3, and so are the same as in the basic CMOS process.

The mask for the seventh step of the process is changed to define the source 35 and the drain 37 within the active area 15 of the JFET 5. The heavy concentration of the N-type impurity is introduced into the source 35 and the drain 37 at the same time as it is introduced into the source 31 and the drain 33 of the N-channel MOS transistor 3.

In an additional step not included in the basic CMOS process, the gate oxide is removed from substantially all the active area 15 of the JFET 5, using a conventional mask and etch technique. An N-type impurity such as phosphorus is introduced into the exposed area defined by the field oxide 21, using conventional implantation or diffusion techniques. The impurity converts the active area 15 of the JFET, except for the source 35, drain 37, and gate 43, into a lightly-doped region of N-type material, which provides the channel region of the JFET 5.

The mask for the eighth step of the process is changed to define the gate 43 between the source 35 and the drain 37 of the JFET 5. The mask is also changed to define the substrate contact 45 surrounding the drain 37. The heavy concentration of the P-type impurity is introduced into the gate 43 and the substrate contact 45 at the same time as it is introduced into the source 39 and the drain 41 of the P-channel MOS transistor 1. The substrate contact 45 provides a high conductivity connection to the substrate 2 to define the potential of the substrate in the vicinity of the JFET 5.

The order of the additional step and the eighth step may be reversed if desired. Preferably, the additional step follows the seventh step and precedes the eighth step.

The masks for the finishing step of the process are changed to provide additional metallic contacts to the electrodes of the JFET 5, and to accommodate the JFET 5 in the passivation layer.

Figure 4:
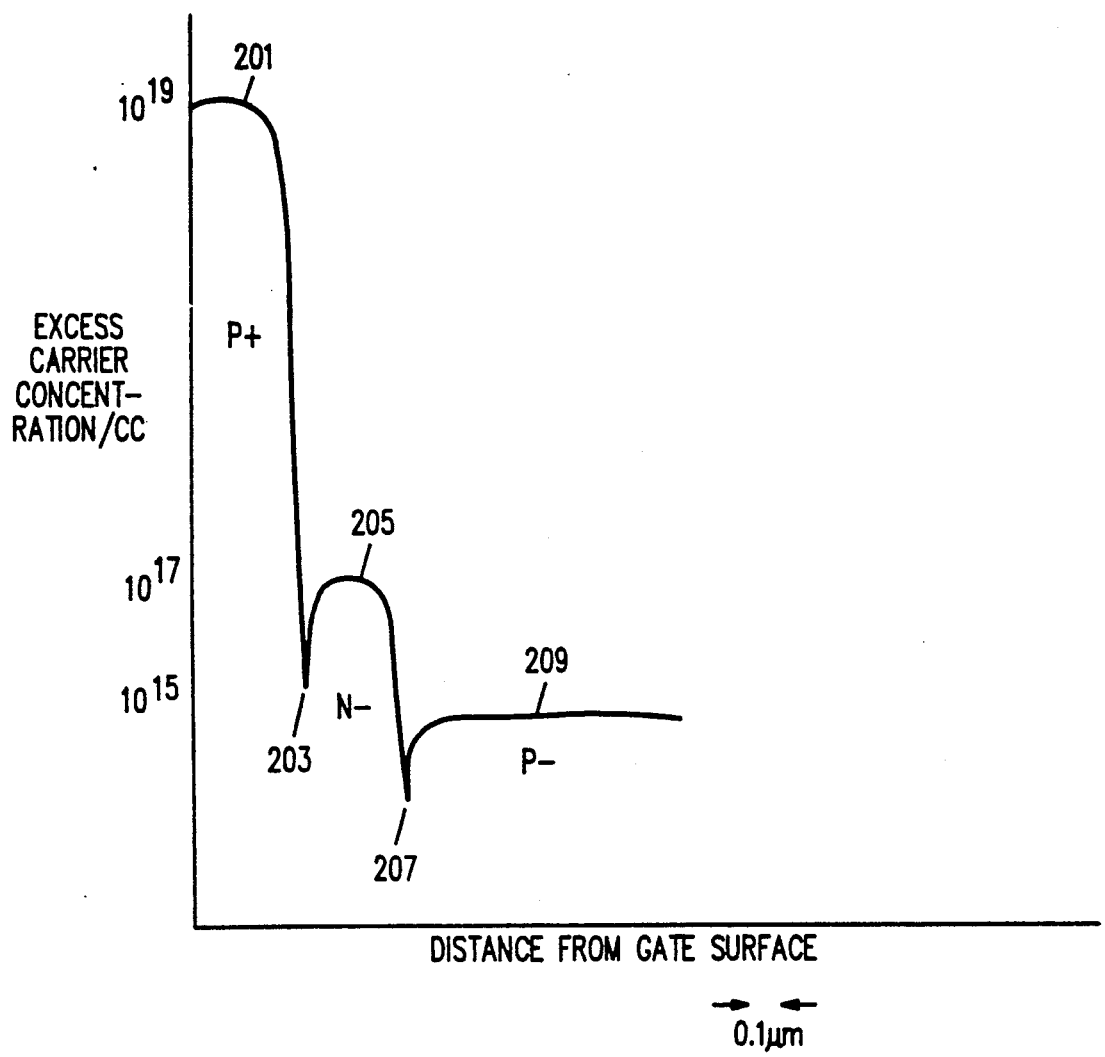
FIG. 4 is a graph showing the concentration of excess carriers plotted against depth below the surface in the gate region of an N-channel JFET made by the modified CMOS process of FIG. 1B.

FIG. 4 shows the concentration of excess carriers per cubic centimeter in the channel of the resulting N-channel JFET plotted against depth below the surface of the gate. In FIG. 4, the excess carrier concentration in the gate 201 is about $10^{19}$/cc. In the interface 203 between the gate and the channel, the concentration falls to about $10^{15}$/cc. The curve shows an excess carrier concentration of about $10^{17}$/cc in the center of the channel 205, which gives a threshold voltage of about $-1$ Volt. The threshold voltage may be varied by changing the concentration of the impurity introduced into the channel region in the additional step of the process. At the interface 207 between the channel and the substrate 209, the excess carrier concentration drops further, and rises back to about $10^{15}$/cc in the substrate 209.

3. Making a P-Channel JFET using the Basic CMOS Process

Figure 1C:
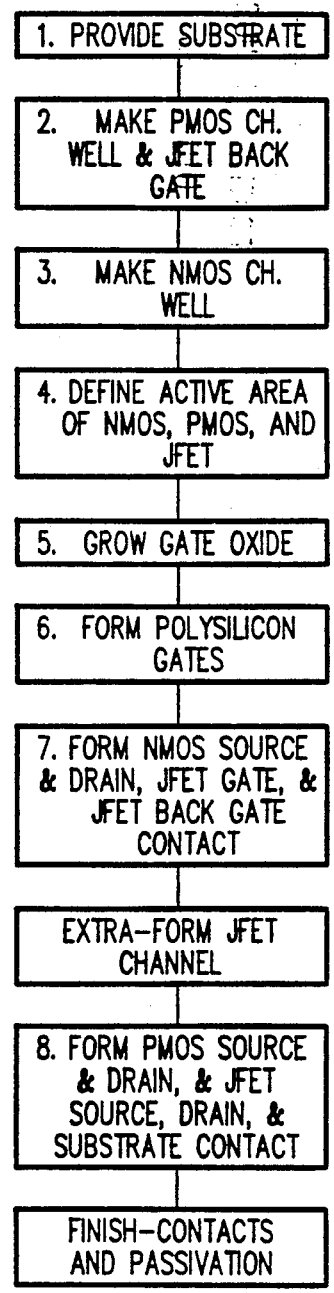
FIG. 1C is a flow chart showing the steps of the CMOS process modified to make a P-channel JFET.
Figure 5:
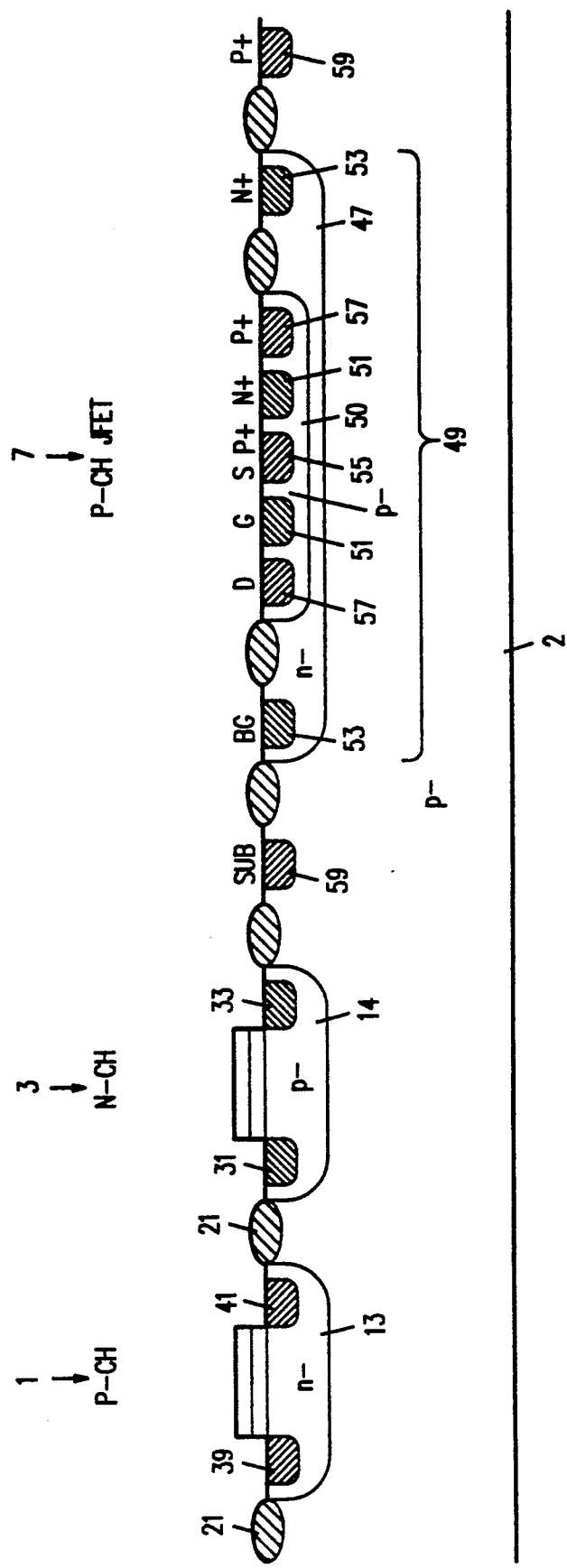
FIG. 5 is a cross sectional view of an integrated circuit device structure including an N-channel MOS transistor, a P-channel MOS transistor, and a P-channel JFET, made by the modified CMOS process of FIG. 1C.

The CMOS process modified according to the second aspect of the invention to also make a P-channel JFET is shown in FIG. 1C. A cross section of an integrated circuit device structure made by the P-channel JFET modified CMOS process of FIG. 1C is shown in FIG. 5. FIG. 5 shows the P-channel MOS transistor 1, the N-channel MOS transistor 3, and the P-channel JFET 7.

In the process of making an P-channel JFET using a modified CMOS process according to the invention, the first seven steps and the finishing step of the basic CMOS process are used unchanged. Mask changes are required in several of the steps of the process to define the elements of the JFET made simultaneously with the elements of the N-channel and P-channel MOS transistors in each step of the process. An additional step is added to the basic CMOS process to provide the channel of the JFET.

No mask is used in the first step of the process.

The mask for the second step of the process is modified to define the back gate well 47 for the JFET 7. The N-type impurity is introduced into the back gate well 47 at the same time as it is introduced into the channel well 13. The back gate well 47 also isolates the channel of the JFET 7 from the P-type substrate 2.

The mask for the third step of the process is unchanged.

The mask for the fourth step of the process is modified to define the active area 49 of the JFET 7. Field oxide is then removed from the active area 49 by the same etching process that removes the field oxide from the active areas of the MOS transistors 1 and 3.

The fifth and sixth steps of the process are concerned only with making the MOS transistors 1 and 3, and so are the same as in the basic CMOS process.

The mask of the seventh step of the process is changed to define the top gate 51 and the back gate contact 53 within the active area 49 of the JFET 7. The heavy concentration of the N-type impurity is introduced into the top gate 51 and the back gate contact 53 at the same time as it is introduced into the source 31 and the drain 33 of the N-channel MOS transistor 3. The back gate contact 53 makes a high conductivity connection to the back gate 45.

In the additional step not included in the basic CMOS process, the gate oxide is removed from substantially all the active area 49 of the JFET 7, using a conventional mask and etch technique. A P-type impurity such as boron is introduced into the exposed area thus defined using a conventional implantation or diffusion technique. The impurity converts the active area 49 of the JFET, except for the source 55, drain 57, and gate 51, into a lightly-doped region of P-type material, which provides the channel region of the P-channel JFET 7.

The mask for the eighth step of the process is changed to define the source 55 surrounded by the gate 51, and the drain 53 surrounding the gate 51, of the JFET 7. The mask is also changed to define the substrate contact 59 surrounding the area drain 53. The heavy concentration of the P-type impurity is introduced into the source 55, the drain 57, and the substrate contact 59 at the same time as it is introduced into the source 39 and the drain 41 of the P-channel MOS transistor 1. The substrate contact 59 provides a high conductivity connection to the substrate to define the potential of the substrate in the vicinity of the JFET 7.

The order of the additional step and the eighth step may be reversed if desired. Preferably, the additional step follows the seventh step and precedes the eighth step.

The masks for the finishing step of the process are changed to provide additional metallic contacts to the electrodes of the JFET 7, and to accommodate the JFET 7 in the passivation layer.

Figure 6:
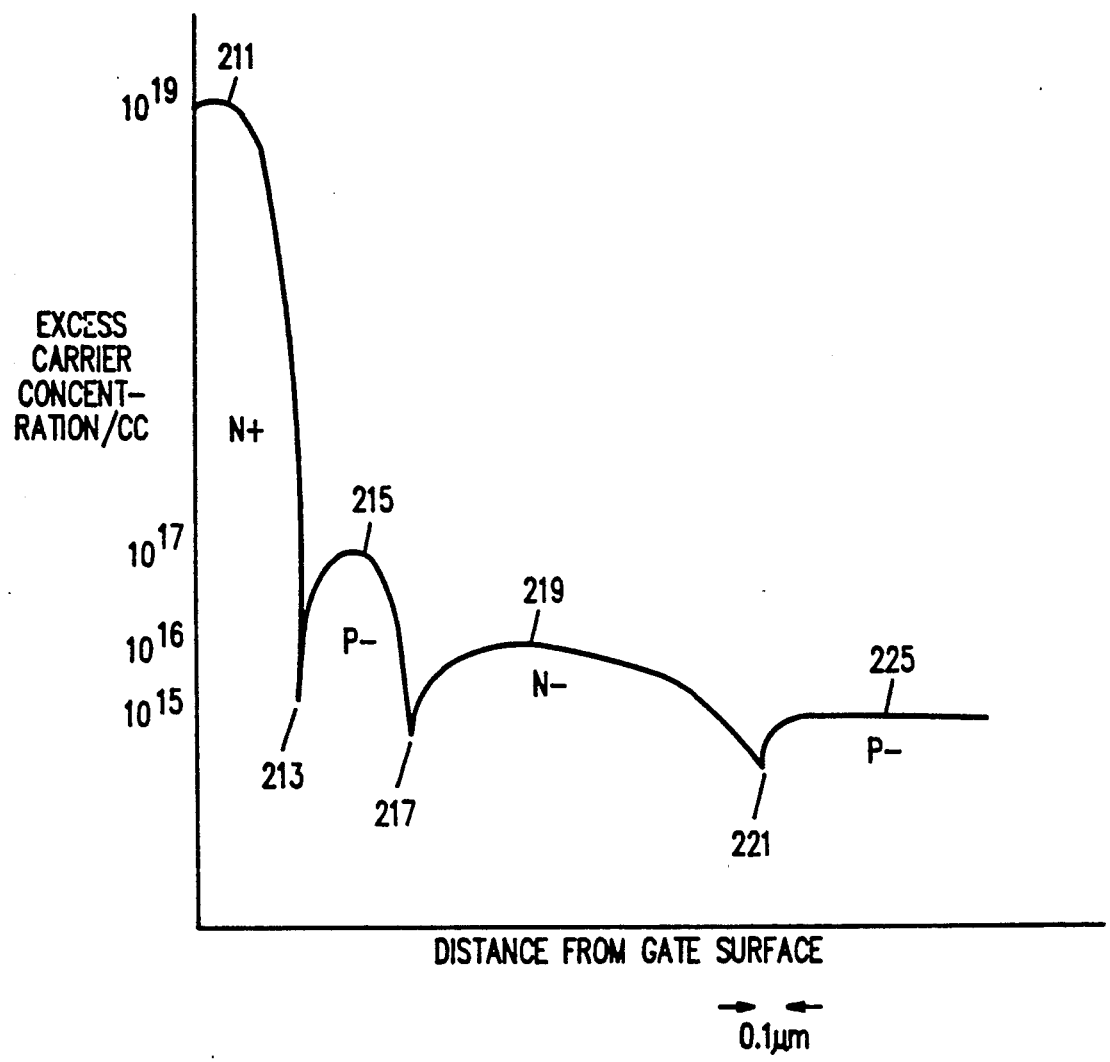
FIG. 6 is a graph showing the concentration of excess carriers plotted against depth below the surface in the gate region of a P-channel JFET made by the modified CMOS process of FIG. 1C.

FIG. 6 shows the concentration of excess carriers per cubic centimeter in the channel of the resulting P-channel JFET plotted against depth below the surface of the gate. In FIG. 6, the excess carrier concentration in the gate 211 is about $10^{19}$/cc. In the interface 213 between the gate and the channel, the excess carrier concentration falls to about $10^{15}$/cc. The curve shows the excess carrier concentration rising to between $10^{16}$ and $10^{17}$ in the center of the channel 215, which gives a threshold voltage of about $-1$ Volt. The threshold voltage may be varied by changing the concentration of the impurity introduced into the channel region in the additional step of the process. At the interface 217 between the channel and the back gate 219, the excess carrier concentration drops to about $10^{15}$/cc, and rises back to about $10^{16}$/cc inside the back gate 219. At the interface 221 between the back gate 219 and the substrate 223, the excess carrier concentration drops to below $10^{15}$/cc, and rises back to about $10^{15}$/cc in the substrate 223.

The basic CMOS process can also be modified to make both N-channel and P-channel JFETs on the same substrate. Mask changes are made to provide the components of both types of JFET, as described above. The modified process also includes both the additional step of the N-channel JFET process and the additional step of the P-channel JFET process described above.

B. Making a JFET Using a Bipolar-CMOS (BiCMOS) Process.

1. The BiCMOS Process

Figure 7A:
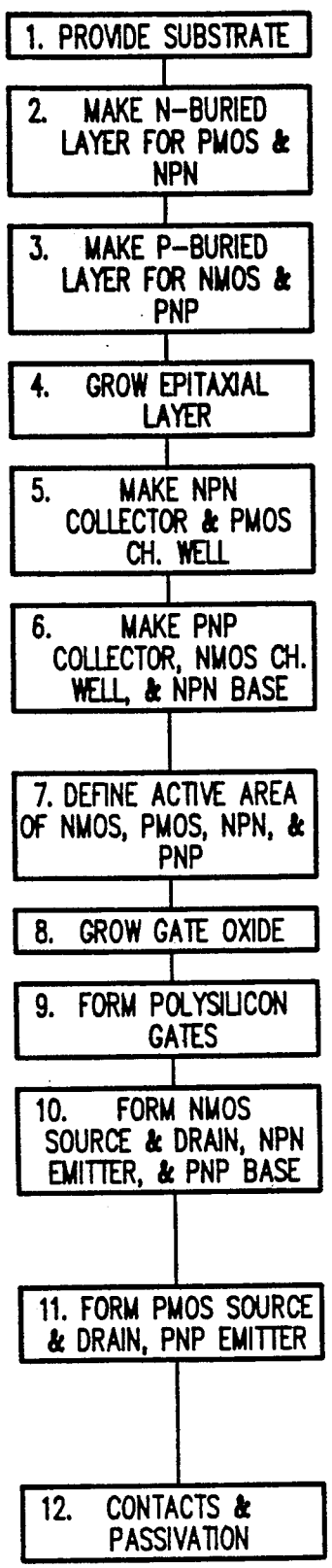
FIG. 7A is a flow chart showing the steps of a typical BiCMOS process.
Figure 8:
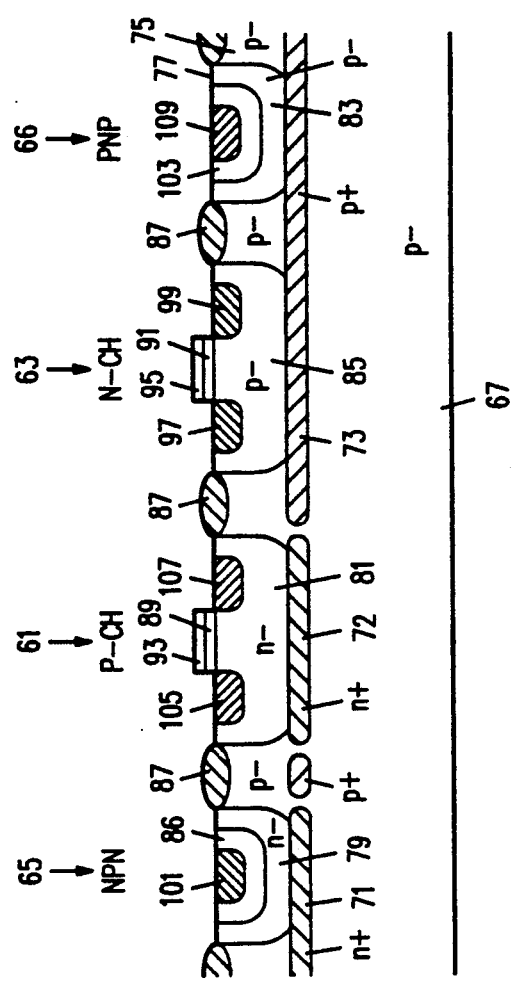
FIG. 8 is a cross sectional view of an integrated circuit device structure, including an N-channel MOS transistor, a P-channel MOS transistor, an NPN bipolar transistor and a PNP bipolar transistor, made by the BiCMOS process of FIG. 7A.

So that the methods according to the invention of making a JFET using a BiCMOS process can be better appreciated, a typical BiCMOS process for making an N-channel MOS transistor, a P-channel MOS transistor, an NPN bipolar transistor, and a PNP bipolar transistor on the same semiconductor substrate will now be described. The BiCMOS process flow is illustrated in FIG. 7A. A cross section of an integrated circuit device structure made by the BiCMOS process of FIG. 7A is shown in FIG. 8. FIG. 8 shows the P-channel MOS transistor 61, the N-channel MOS transistor 63, the NPN bipolar transistor 65, and the PNP bipolar transistor 66.

In the first step of the process, a substrate 67 of a semiconductor material, preferably silicon, lightly doped with a P-type impurity such as boron is provided. The surface of the substrate is indicated by the arrow 69.

In the second step, the surface of the substrate is oxidized and N-buried layer regions 71 and 72 are defined using a conventional mask and etch process. A high concentration of N-type impurity such as arsenic is introduced into the regions 71 and 72 using a conventional implantation or diffusion technique. The impurity converts the N-buried layer regions 71 and 72 into high conductivity N+ regions. The N-buried layer 71 provides a high conductivity path between the collector and the collector contact area of the NPN transistor 65.

In the third step, the surface of the substrate is re-oxidized and the P-buried layer region 73 is defined using a conventional mask and etch process. The P-buried layer region covers all of the surface of the substrate not occupied by N-buried layer regions. A high concentration of P-type impurity such as boron is introduced into the region 73 using a conventional implantation or diffusion technique. The impurity converts the P-buried layer region 73 into a high conductivity P+ region. The P-buried layer 73 provides a high conductivity path between the collector and the collector contact area of the PNP transistor 66.

In the fourth step, oxide is removed from the surface of the substrate, and a layer of silicon 75, lightly doped with a P-type impurity such as boron, is epitaxially grown over the surface of the substrate 67. The surface 77 of the epitaxial layer 75 provides a new surface for the substrate.

In the fifth step, the well regions 79 and 81 in the epitaxial layer above the N-buried layers 71 and 72 are defined using a conventional mask and etch process. An N-type impurity such as phosphorus is introduced into the collector well 79 and the channel well 81 using conventional implantation or diffusion techniques. The impurity is driven deep into the collector well 79 and the channel well 81 to contact the N-buried layers 71 and 72, respectively. The impurity converts the collector well 79 and the channel well 81 into relatively lightly doped N-type regions. The collector well 79 provides the collector region of the NPN transistor 65, and the channel well 81 provides the channel region of the P-channel MOS transistor 61.

In the sixth step, the collector well 83 and the channel well 85 are defined in the epitaxial layer above the P-buried layer 73, and the NPN base 86 is defined in the collector well 79 of the NPN transistor 65. The regions are defined using a conventional mask and etch process. A P-type impurity such as boron is introduced into the collector well 83, the channel well 85, and the NPN base 86 using a conventional implantation or diffusion technique. The impurity converts the collector well 83, the channel well 85, and the NPN base 86 into relatively lightly doped P-type regions. The collector well 83 provides the collector of the PNP transistor 66 and the channel well 85 provides the channel of the N-channel MOS transistor 63.

In the seventh step of the BiCMOS process, a layer of field oxide 87 is grown on the substrate. The field oxide is then etched using a conventional mask and etch process to define the active areas of the N-channel MOS transistor 61, the P-channel MOS transistor 63, the NPN bipolar transistor 65, and the PNP bipolar transistor 66.

In the eighth step, a layer of gate oxide, including the parts marked 89 and 91, is grown over the active areas of the P-channel MOS transistor 61 and the N-channel MOS transistor 63.

In the ninth step, a layer of polysilicon is deposited over the entire area of the substrate 67, doped, and etched, using a standard mask and etch process, to provide the gates 93 and 95 of the P-channel and N-channel MOS transistors, respectively.

In the tenth step, the layer of gate oxide is etched to define the source 97 and the drain 99 in the channel well 85 of the N-channel MOS transistor 63, the NPN emitter 101 in the NPN base 86 of the NPN transistor 65, and the PNP base 103 in the collector well 83 of the PNP transistor 66. These areas are defined using a standard mask and etch process. An N-type impurity such as arsenic is introduced into the source 97, the drain 99, the NPN emitter 101, and the PNP base 103 using a conventional implantation or diffusion technique. The impurity converts the source 97, the drain 99, the NPN emitter 101, and the PNP base 103 into relatively heavily doped N+ regions. Using the gate oxide to define the source 97 and the drain 99 ensures that the source and drain are correctly aligned with the gate 95.

In the eleventh step of the BiCMOS process, the gate oxide is etched to define the source 105 and the drain 107 in the channel well 81 of the P-channel MOS transistor 61, and the PNP emitter 109 of the PNP transistor 66. These elements are defined using a conventional mask and etch process. A P-type impurity such as boron is introduced into the source 105, the drain 107, and the PNP emitter 109 using a conventional implantation or diffusion technique. The impurity converts the source 105, the drain 107, and the PNP emitter 109 into relatively heavily doped P+ regions. Using the gate oxide to define the source 105 and the drain 107 ensures that the source and drain are correctly aligned with the gate 93.

The BiCMOS process is completed by a finishing step that provides metallic contacts (not shown) to the various electrodes of the transistors, and provides a passivation layer (not shown).

A variety of specific fabrication mechanisms can be used to carry out the steps of the method described above, and to carry out the steps of the methods to be described below.

2. Making an N-Channel JFET using a BiCMOS Process

Figure 7B:
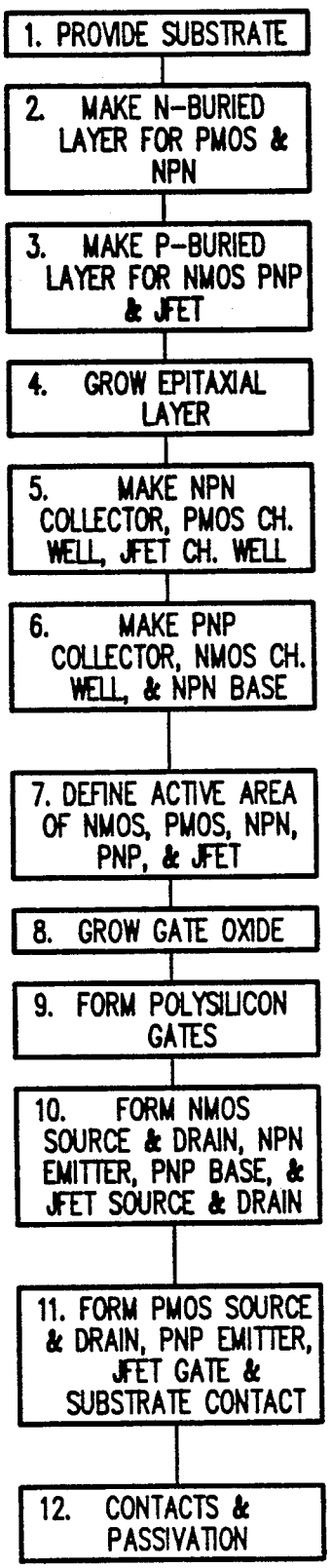
FIG. 7B is a flow chart showing the steps of the BiCMOS process modified to make an N-channel JFET.
Figure 9:
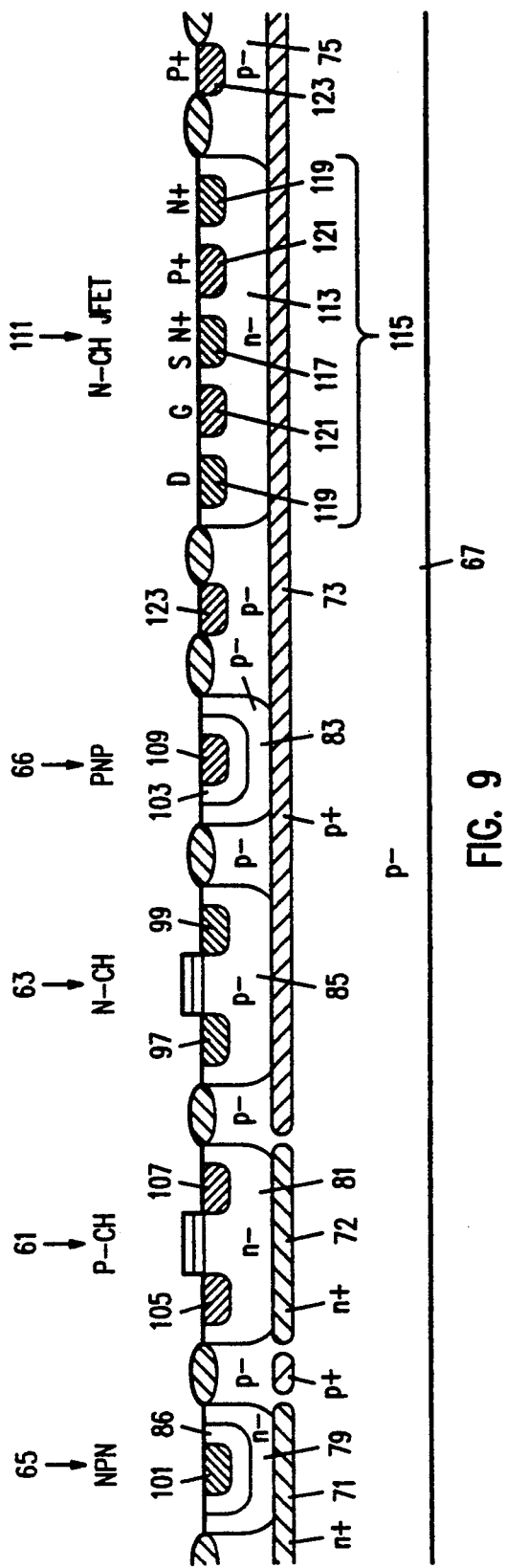
FIG. 9 is a cross sectional view of an integrated circuit device structure including an N-channel MOS transistor, a P-channel MOS transistor, an NPN bipolar transistor, and an N-channel JFET, made by the modified BiCMOS process of FIG. 7B.

The BiCMOS process modified according to the third aspect of the invention to also make an N-channel JFET is shown in FIG. 7B. A cross section of an integrated circuit device structure made by N-channel JFET modified BiCMOS process is shown in FIG. 9. FIG. 9 shows the P-channel MOS transistor 61, the N-channel MOS transistor 63, the NPN bipolar transistor 65, the PNP bipolar transistor 66, and the N-channel JFET 111.

In the process of making an N-channel JFET using the BiCMOS process according to the invention, all of the steps of the BiCMOS process are used unchanged. Mask changes are required in several of the steps of the process to define the elements of the JFET made simultaneously with the elements of the N-channel and P-channel MOS transistors and of the bipolar transistors in each step of the process. No additional steps are required to make the JFET.

No mask is involved in the first step of the process.

The mask for the second step of the process is unchanged.

If the P-buried layer 73 does not already extend to the part of the substrate that will be occupied by the N-channel JFET 111, the mask for the third step of the process is modified to extend the P-buried layer 73 to the part of the substrate that will be occupied by the JFET 111. The part of the P-buried layer 73 below the N-channel JFET 111 defines the depth of the channel of the JFET 111.

No mask is involved in the fourth step of the process.

The mask for the fifth step of the process is modified to define, in the epitaxial layer 75 above part of the P-buried layer 73, the channel well 113 of the JFET 111. The N-type impurity is introduced into the channel well 113 at the same time as it is introduced into the collector well 79 and the channel well 81. The N-type impurity is driven into the epitaxial layer so that it contacts the P-buried layer 73.

The mask for the sixth step need not be changed. However, it is preferred that the mask for the sixth step be modified to bring the P-type well region 83, the P-type well region 85, and any other P-type well regions adjacent to the N-type well region 113, into contact with the N-type well region 113. The extended well regions 83 and 85 are shown in FIG. 9.

The mask for the seventh step is modified to define the active area 115 the JFET 111. Field oxide is then removed from the active area 115 by the same etching process that removes the field oxide from the active areas of the MOS transistors 61 and 63, the NPN transistor 65, and the PNP transistor 66.

The eighth and ninth steps of the process are concerned only with making the MOS transistors 61 and 63, and so the masks for these steps are unchanged.

The mask for the tenth step of the process is changed to define the source 117 and drain 119 in the channel well 113 of the JFET 111. The heavy concentration of N-type impurity is introduced into the source 117 and the drain 119 at the same time as it is introduced into the source 97 and the drain 99 of the N-channel MOS transistor 63, into the emitter of the NPN transistor 65, and into the base of the PNP transistor 66.

The mask for the eleventh step of the process is changed to define the gate 121 between the source 117 and the drain 119 of the JFET 65. The mask is also changed to define the substrate contact 123 surrounding the drain 119. The heavy concentration of the P-type impurity is introduced into the gate 121 and the substrate contact 123 at the same time as it is introduced into the source 105 and the drain 107 of the P-channel MOS transistor 61, and into the emitter of the PNP transistor 66. The substrate contact 123 provides a high conductivity connection to the substrate to define the potential of the substrate in the vicinity of the JFET 111.

The masks for the finishing step of the process are changed to provide additional metallic contacts to the electrodes of the JFET 111 and to the guard ring, and to accommodate the JFET 111 in the passivation layer.

Figure 10:
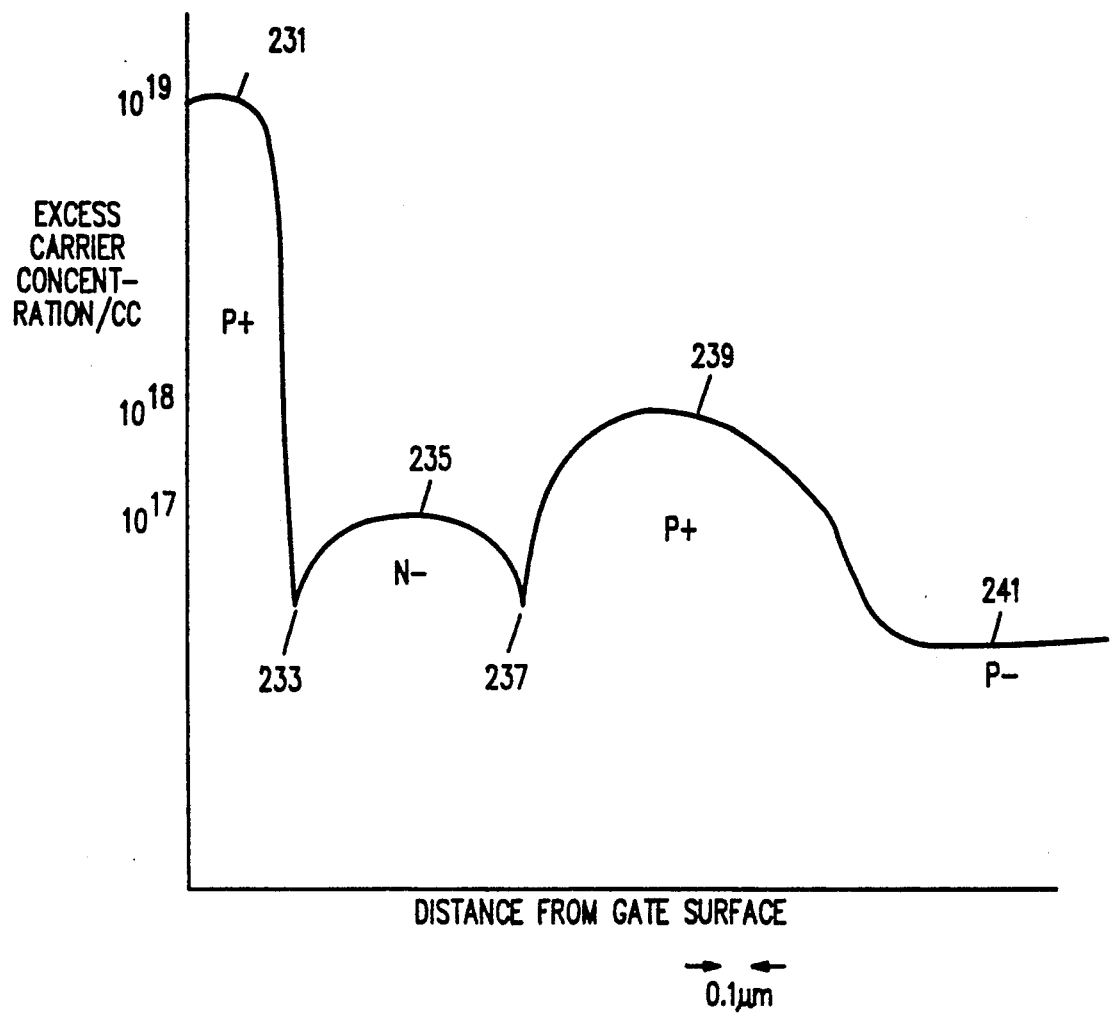
FIG. 10 is a graph showing the concentration of excess carriers plotted against depth below the surface in the gate region of an N-channel JFET made by the modified BiCMOS process of FIG. 7B.

FIG. 10 shows the concentration of excess carriers per cubic centimeter in the channel of the N-channel JFET 111 (FIG. 9) plotted against depth below the surface of the gate. In FIG. 10, the excess carrier concentration in the gate 231 is about $10^{19}$/cc. In the interface 233 between the gate and the channel, the excess carrier concentration falls to about $10^{16}$/cc. The excess carrier concentration rises to about $10^{17}$/cc in the center of the channel 235. At the interface 237 between the channel and the buried layer 239, the excess carrier concentration drops back to about $10^{16}$/cc, and rises to about $10^{18}$/cc in the buried layer 239. The excess carrier concentration falls to about $10^{15}$/cc in the substrate 241.

Table 1 shows results obtained from test patterns. It is anticipated that improved measurement techniques will show a threshold voltage offset of less than 200 $\mu$V, and an threshold voltage drift of less than 50 $\mu$V.

TABLE 1

| Threshold voltage | $V_T$ | −1 V |
|---|---|---|
| Transconductance | gm | 200 $\mu$S ($V_{GS} = 0$) |
| Drain-Source Breakdown Voltage | $BV_{DSS}$ | 15 V |
| Gate Current | $I_{GATE}$ | 5 pA |
| Threshold voltage offset | $V_{T(offset)}$ | 1 mV |
| Threshold voltage drift | $V_{T(drift)}$ | 200 $\mu$V |

Figure 11:
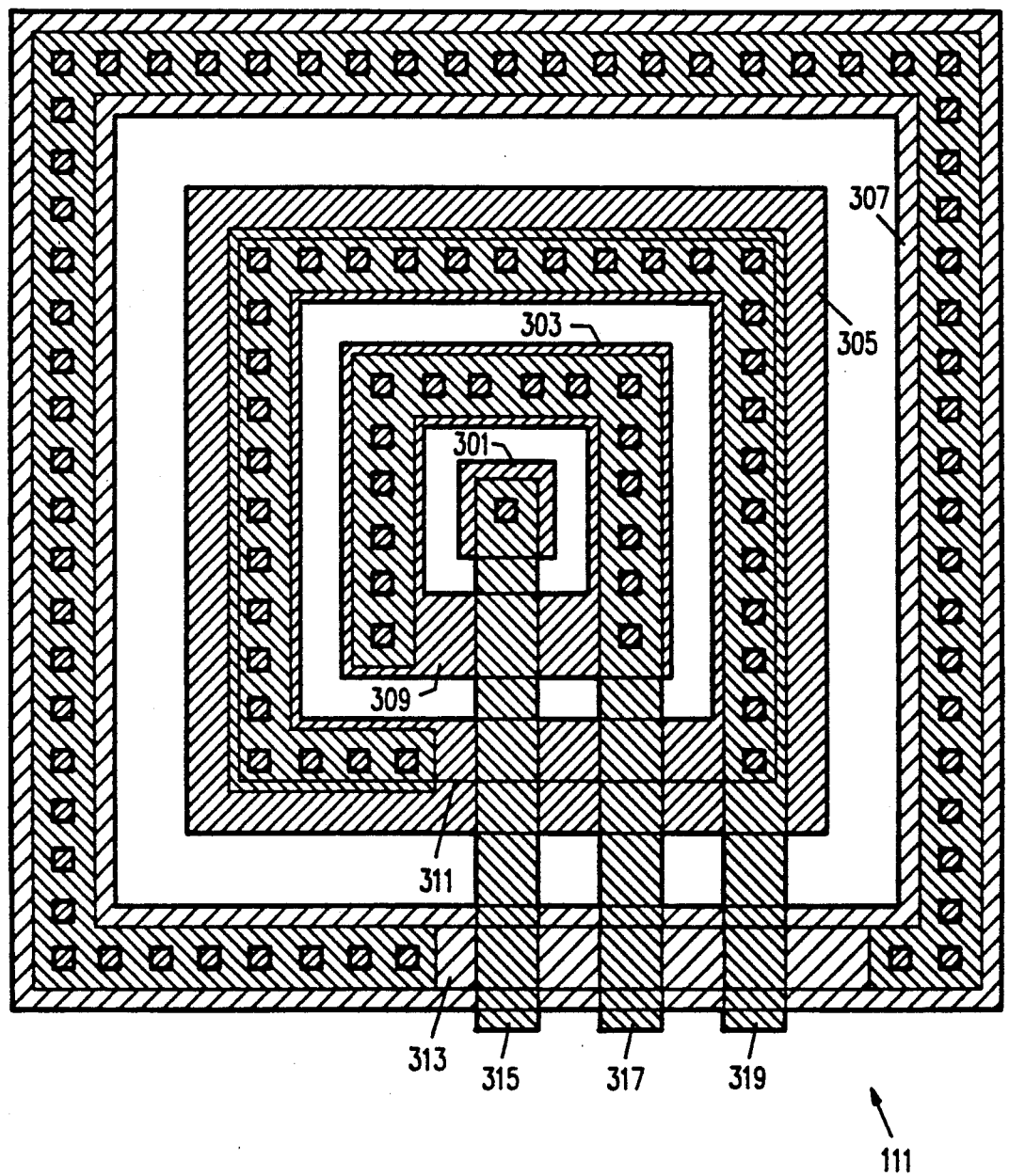
FIG. 11 is a plan view of an N-channel JFET made by the modified BiCMOS process of FIG. 7B.

A view of the surface of the JFET 111 is shown in FIG. 11. The source 301 is in the middle, surrounded by the gate 303. The drain 305 surrounds the gate. The substrate contact 307 surrounds the drain. Parts 309, 311, and 313 of the gate, drain, and substrate contact, respectively, are not metallized. This enables the source metallization 315, to pass over the gate 303, the drain 305, and the substrate contact 307; the gate metallization 317 to pass over the drain 305 and the substrate contact 307; and the drain metallization 319 to pass over the substrate contact 307.

3. Making a P-Channel JFET using a BiCMOS Process

Figure 7C:
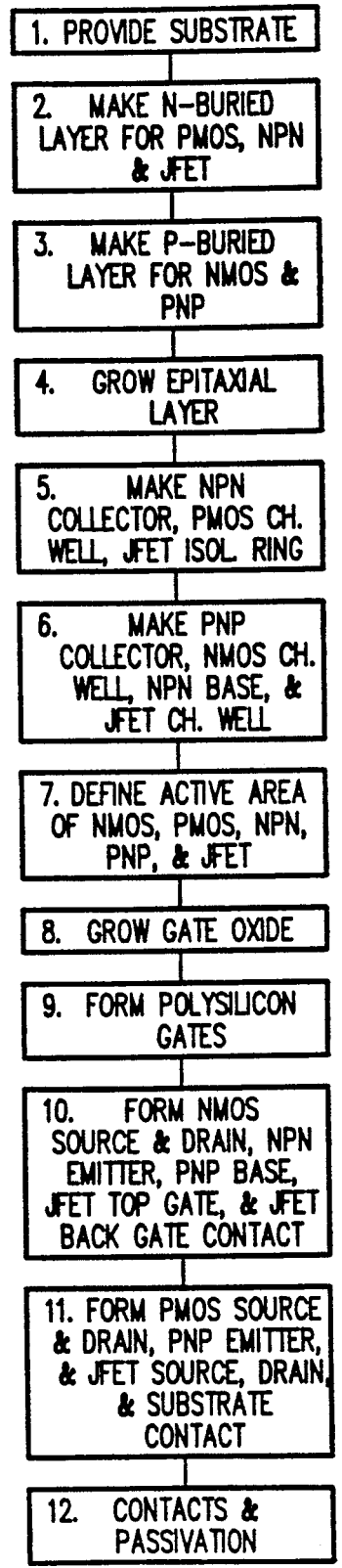
FIG. 7C is a flow chart showing the steps of the BiCMOS process modified to make a P-channel JFET.
Figure 12:
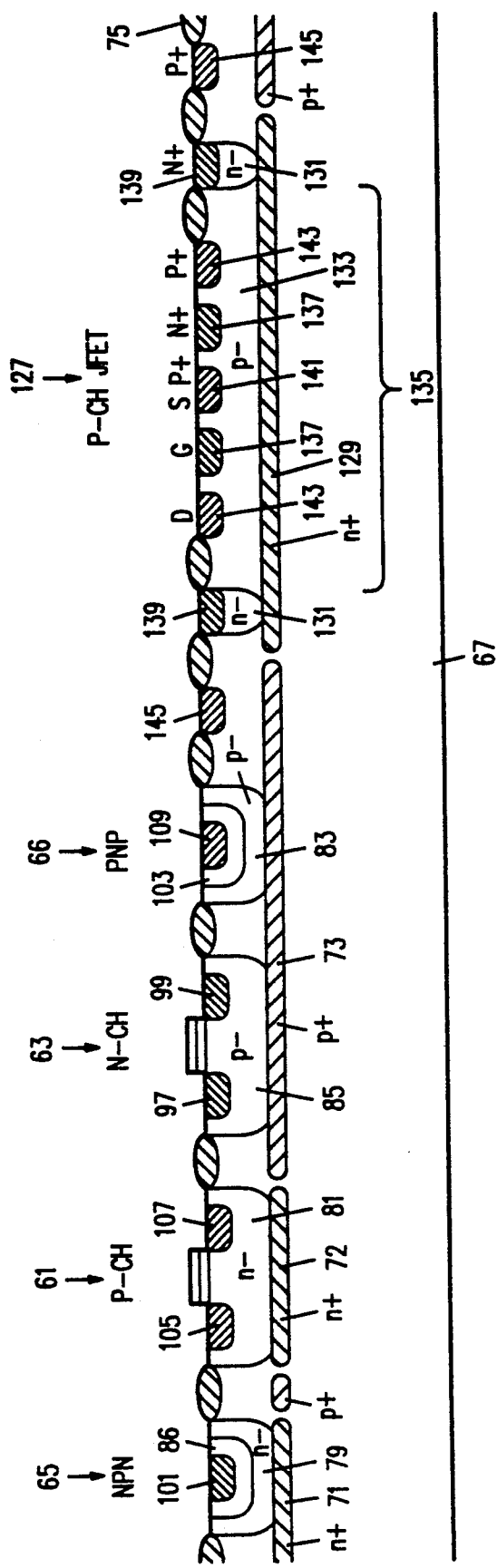
FIG. 12 is a cross sectional view of an integrated circuit device structure including an N-channel MOS transistor, a P-channel MOS transistor, an NPN bipolar transistor, and a P-channel JFET, made by the modified BiCMOS process of FIG. 7C.

The BiCMOS process modified according to the fourth aspect of the invention to also make a P-channel JFET is shown in FIG. 7C. A cross section of an integrated circuit device structure made by the P-channel JFET modified BiCMOS process of FIG. 7C is shown in FIG. 12. FIG. 12 shows the P-channel MOS transistor 61, the N-channel MOS transistor 63, the NPN bipolar transistor 65, the PNP transistor 66, and the P-channel JFET 127.

In the process of making a P-channel JFET using the BiCMOS process according to the invention, all of the steps of the BiCMOS process are used unchanged. Mask changes are required in several of the steps of the process to define the elements of the JFET made simultaneously with the elements of the N-channel and P-channel MOS transistors and of the bipolar transistors in each step of the process. No additional steps are required to make the JFET.

No mask is involved in the first step of the process.

The mask for the second step of the process is modified to provide an N-buried layer 129 to accommodate the P-channel JFET 127. The N-buried layer 129 provides the back gate of the JFET 127, and also provides part of the isolation between the P-type channel region of the JFET 127 and the P-type substrate 67.

The mask for the third step of the process is unchanged.

No mask is involved in the fourth step of the process.

The mask for the fifth step of the process is modified to define, in the epitaxial layer 75 above the N-buried layer 129, the isolation ring 131. The N-type impurity is introduced into the isolating ring 131 at the same time as it is introduced into the collector well 79 and the channel well 81. The N-type impurity is driven into the epitaxial layer so that it contacts the N-buried layer 129. The isolation ring 131, together with the N-buried layer 129, completely isolates the channel of the P-channel JFET 127 from the substrate 67 and the other devices formed therein. The isolation ring 131 also provides an electrical connection to the back gate of the JFET 127 formed by the N-buried layer 129.

The mask for the sixth step is modified to define the channel well 133 of the P-channel JFET 127 above the N-buried layer 129 inside the isolation ring 131. An impurity is introduced into the channel well 133 at the same time as it is introduced into the collector well 83, the channel well 85, and the NPN base region 86, using a conventional implantation or diffusion technique. The impurity converts the channel well 133 into a relatively lightly doped P-type region.

The mask for the seventh step is modified to define the active area 135 the JFET 127. Field oxide is then removed from the active area 135 of the JFET 127 by the same etching process that removes the field oxide from the active areas of the MOS transistors 61 and 63, the NPN transistor 65, and the PNP transistor 66.

The eighth and ninth steps of the process are concerned only with making the MOS transistors 61 and 63, and so the masks for these steps are unchanged.

The mask for the tenth step of the process is changed to define the gate 137 in the channel well 133 of the JFET 127. The mask is also changed to define the back gate contact 139 in the isolation ring 131. The heavy concentration of the N-type impurity is introduced into the gate 137 and the back gate contact 139 at the same time as it is introduced into the source 97 and the drain 99 of the N-channel MOS transistor 63, into the emitter 101 of the NPN transistor 65, and into the base of the PNP transistor 66. The back gate contact 139 provides a high conductivity contact with the isolation ring 131, and hence with the back gate of the P-channel JFET 127 provided by the N-buried layer 129.

The mask for the eleventh step of the process is changed to define the source 141 and the drain 143 of the JFET 127. The source 141 is surrounded by the gate 137, and the drain 143 surrounds the gate 137. The mask is also changed to define the substrate contact 145 surrounding the back gate contact 139. The heavy concentration of the P-type impurity is introduced into the source 141, the drain 143, and the substrate contact 145 at the same time as it is introduced into the source 105 and the drain 107 of the P-channel MOS transistor 61, and into the emitter of the PNP transistor 66. The substrate contact 145 provides a high conductivity connection to the substrate 67 to define the potential of the substrate adjacent to the isolation ring 131.

The masks for the finishing step of the process are changed to provide additional metallic contacts to the electrodes of the JFET 127, and to accommodate the JFET 127 in the passivation layer.

Figure 13:
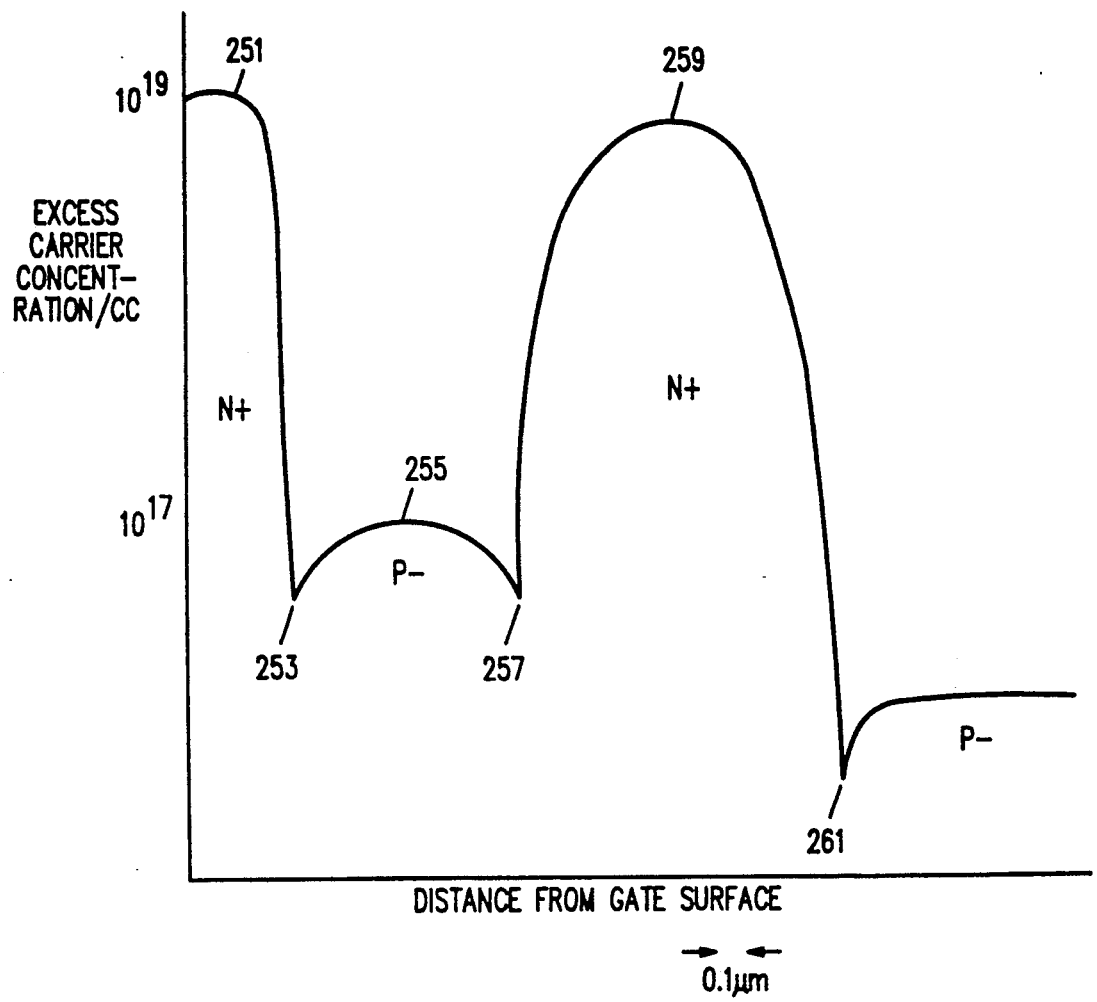
FIG. 13 is a graph showing the concentration of excess carriers plotted against depth below the surface in the gate region of a P-channel JFET made by the modified BiCMOS process of FIG. 7C.

FIG. 13 shows the concentration of excess carriers per cubic centimeter in the channel of the P-channel JFET 127 (FIG. 11) plotted against depth below the surface of the gate. In FIG. 13, the excess carrier concentration in the gate 251 is about $10^{19}$/cc. In the interface 253 between the gate and the channel, the excess carrier concentration falls to about $10^{16}$/cc. The excess carrier concentration rises to about $10^{17}$/cc in the center of the channel 255. At the interface 257 between the channel and the N-buried layer 259, the excess carrier concentration drops back to about $10^{16}$/cc, and rises to about $10^{19}$/cc in the buried layer 259. The excess carrier concentration falls to about $10^{14}$/cc at the interface 261 between the N-buried layer and the substrate 263, and rises to about $10^{15}$/cc in the substrate 263.

Test patterns show the results in table 2. It is anticipated that improved measurement techniques will show a threshold voltage offset of less than 200 μV, and an threshold voltage drift of less than 50 μV.

TABLE 1

| Threshold voltage | $V_T$ | 1 V |
|---|---|---|
| Transconductance | gm | 200 μS ($V_{GS} = 0$) |
| Drain-Source Breakdown Voltage | $BV_{DSS}$ | −15 V |
| Gate Current | $I_{GATE}$ | 5 pA |
| Threshold voltage offset | $V_{T(offset)}$ | 1 mV |
| Threshold voltage drift | $V_{T(drift)}$ | 200 μV |

Figure 14:
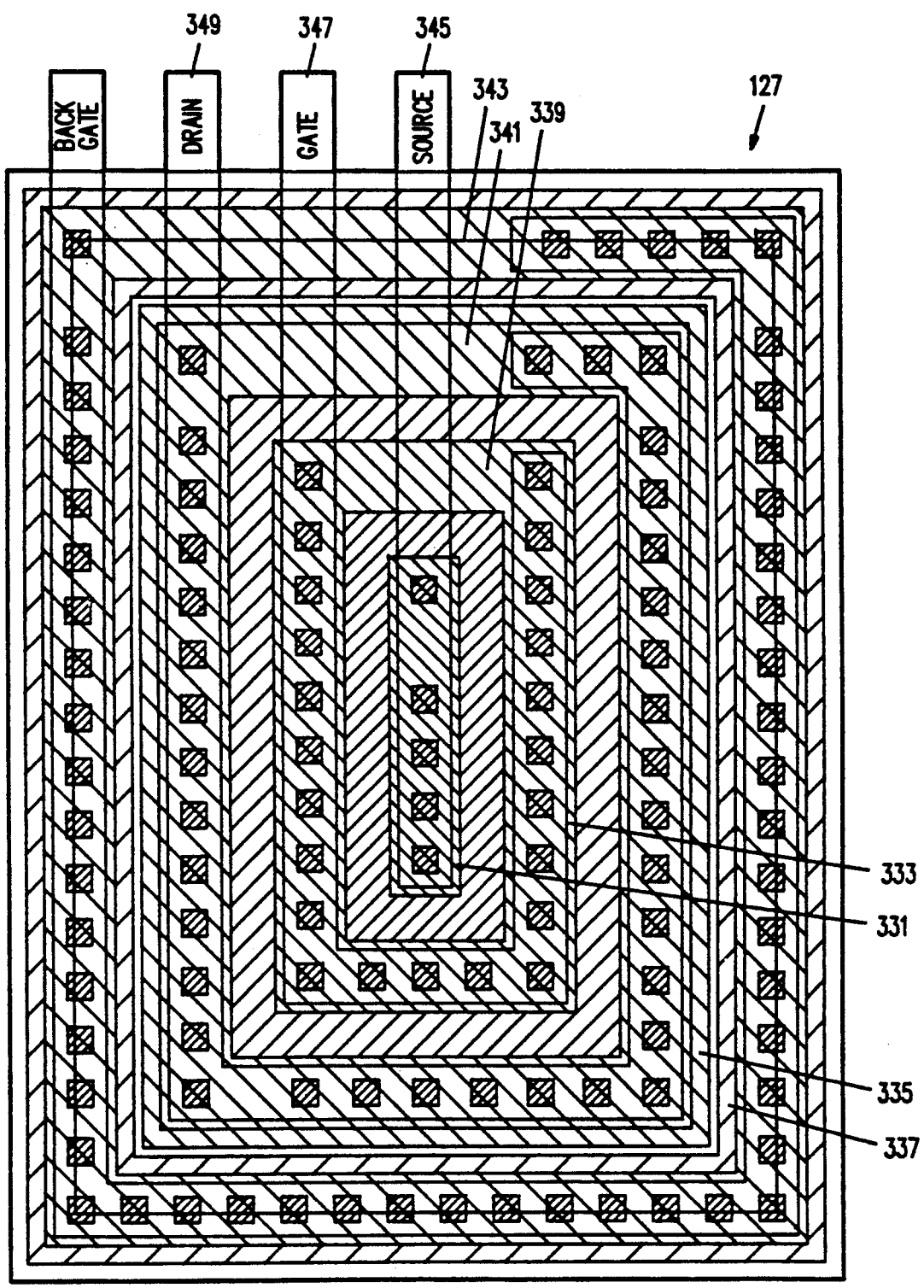
FIG. 14 is a plan view of an N-channel JFET made by the modified BiCMOS process of FIG. 7C.

A view of the surface of the JFET 127 is shown in FIG. 14. The source 331 is in the middle, surrounded by the top gate 333. The drain 335 surrounds the top gate. The back gate 337 surrounds the drain. Parts 339, 341, and 343 of the top gate, drain, and back gate, respectively, are not metallized. This enables the source metallization 345, to pass over the top gate 333, the drain 335, and the back gate 337; the top gate metallization 347 to pass over the drain 335 and the back gate 337; and the drain metallization 349 to pass over the back gate 337. The substrate connection is not shown in this drawing.

With additional appropriate mask changes, the BiCMOS process described above can also be used to make both N-channel and P-channel JFETs on the same semiconductor substrate without additional process steps.

We claim:

1. A method of fabricating elements of a junction field-effect transistor while simultaneously fabricating the elements of a first metal-oxide-semiconductor transistor and a second metal-oxide-semiconductor transistor having a channel conductivity of the opposite type to the first metal-oxide-semiconductor transistor, the transistors each having a source, a drain, a gate, and a channel region, the method comprising the steps of:
   (a) providing a substrate (2) of a semiconductor material having a conductivity of a first type and including,
      (i) a first part, a portion of the first part forming the channel region of the second metal-oxide-semiconductor transistor (3), and
      (ii) a second part, including a MOS channel well region (13) of a second conductivity type, opposite to the first conductivity type, the MOS channel well region forming the channel region of the first metal-oxide-semiconductor transistor (1);
   (b) introducing an impurity into first selected regions (31, 33) in the first part of the substrate to form the source and drain of the second metal-oxide-semiconductor transistor, and into a second selected region (35) and a third selected region (37) in the first part of the substrate to form the source and drain, respectively, of the junction field-effect transistor (5), such that the first selected regions, the second selected region, and the third selected region are of the second conductivity type;
   (c) introducing an impurity into a fourth selected region (19), substantially bounded by the third selected region, to form the channel region of the junction field-effect transistor, such that the fourth selected region is of the second conductivity type; and
   (d) introducing an impurity into fifth selected regions (39, 41) in the MOS channel well region to form the source and drain of the first metal-oxide-semiconductor transistor, and into a sixth selected region (43) between the second selected region and the third selected region to form the gate of the junction field-effect transistor, such that the fifth selected regions and the sixth selected region are of the first conductivity type.

2. The method of claim 1, wherein
   in the step of providing a substrate of a semiconductor material,
      the MOS channel well region (13) is a first MOS channel well region, and
      the first part of the substrate includes a second MOS channel well region (14) having a conductivity of the first type, the second MOS channel well region forming the channel region of the second MOS transistor, and
   in the step of introducing an impurity into first selected regions in first part of the substrate and into a second selected region and a third selected region in the first part of the substrate, the impurity is introduced into the first selected regions in the second MOS channel well region to form the source and drain of the second MOS transistor.

3. The method of claims 1 or 2, wherein
the substrate (2) has a conductivity,
the channel region (19) of the junction field effect transistor has a conductivity, the conductivity of the channel region being about one hundred times greater than the conductivity of the substrate, and
the gate (43) of the junction field effect transistor has a conductivity, the conductivity of the gate being about one hundred times greater than the conductivity of the channel region.

4. The method of claims 1 or 2, wherein the first MOS transistor (1) is a P-channel MOS transistor, the second MOS transistor (3) is an N-channel MOS transistor, and the junction field effect transistor (5) is an N-channel junction field effect transistor.

5. The method of claims 1 or 2, wherein the step of introducing an impurity into first selected regions in the first part of the substrate and into a second selected region and a third selected region in the first part of the substrate additionally includes introducing the impurity into a seventh selected region (45) surrounding the third selected region to form a substrate contact, such that the seventh selected region is of the first conductivity type.

6. The method of claims 1 or 2, wherein the semiconductor material is silicon.

7. A method of fabricating elements of a junction field-effect transistor while simultaneously fabricating the elements of a first metal-oxide-semiconductor transistor and a second metal-oxide-semiconductor transistor having a channel conductivity of the opposite second type to the first metal-oxide-semiconductor transistor, the metal-oxide-semiconductor transistors each having a source, a drain, a gate, and a channel region, and the junction field-effect transistor additionally having a back gate, the method including the steps of:
(a) providing a substrate (2) of a semiconductor material having a conductivity of a first type, and including
   (i) a first part, a portion of the first part forming the channel region of the second metal-oxide-semiconductor transistor (3), and
   (ii) a second part,
(b) introducing an impurity into an MOS channel well region (13) in the second part of the substrate to form the channel region of the first metal-oxide-semiconductor transistor (1), and into a JFET well region (47) in the second part of the substrate to form the back gate of the junction field-effect transistor (7), such that the MOS channel well region and the JFET well region are of a second conductivity type, opposite to the first conductivity type;
(c) introducing an impurity into first selected regions (31, 33) in the first part of the substrate to form the source and drain of the second metal-oxide-semiconductor transistor, and into a second selected region (51) in the JFET well region to form the gate of the junction field-effect transistor, such that the first selected regions and the second selected region are of the second conductivity type;
(d) introducing an impurity into a third selected region (50) in the JFET well region to form the channel region of the junction field-effect transistor, such that the third selected region is of the first conductivity type;
(e) introducing an impurity into fourth selected regions (39, 41) in the MOS channel well region to form the source and drain of the first metal-oxide-semiconductor transistor, and into a fifth selected region (55) and a sixth selected region (57) in the third selected region, adjacent to the second selected region, to form the source and drain, respectively, of the junction field-effect transistor, such that the fourth selected regions, the fifth selected region, and the sixth selected region are of the first conductivity type.

8. The method of claim 7, wherein
in the step of introducing an impurity into an MOS channel well region in the second part of the substrate and into a JFET well region in the second part of the substrate, the impurity is introduced into a first MOS channel well region (13),
the method additionally comprises introducing an impurity into a second MOS channel well region (14) in the first part of the substrate to form the channel region of the second metal-oxide-semiconductor transistor, such that the second MOS channel well region is of the first conductivity type; and
in the step of introducing an impurity into first selected regions in the first part of the substrate and into a second selected region in the JFET well region, the impurity is introduced into the first selected regions in the second MOS channel well region to form the source and drain of the second MOS transistor.

9. The method of claims 7 or 8, wherein
the substrate (2) has a conductivity,
the channel region (50) of the junction field effect transistor has a conductivity, the conductivity of the channel region being about one hundred times greater than the conductivity of the substrate, and
the gate (51) of the junction field effect transistor has a conductivity, the conductivity of the gate being about one hundred times greater than the conductivity of the channel region.

10. The method of claims 7 or 8, wherein the first MOS transistor (1) is a P-channel MOS transistor, the second MOS transistor (3) is an N-channel MOS transistor, and the junction field effect transistor (7) is a P-channel junction field effect transistor.

11. The method of claims 7 or 8, wherein the step of introducing an impurity into fourth selected regions and into a fifth selected region and a sixth selected region additionally includes introducing an impurity into a seventh selected region (59) outside the JFET well region to form a substrate contact, such that the seventh selected region is of the first conductivity type.

12. The method of claims 7 or 8, wherein the step of introducing an impurity into first selected regions and into a second selected region in the JFET well region further includes introducing an impurity into an eighth selected region (53) in the JFET well region outside the third selected region to form a back gate connection, such that the eighth selected region is of the second conductivity type.

13. The method of claim 12, wherein the step of introducing an impurity into fourth selected regions and into a fifth selected region and a sixth selected region additionally includes introducing an impurity into a seventh selected region (59) outside the JFET well region and surrounding the eighth selected region to form a substrate contact, such that the seventh selected region is of the first conductivity type.

14. The method of claim 7, wherein the method is for making the elements of a first junction field effect transistor and is additionally for making the elements of a second junction field-effect transistor with an opposite polarity to the first junction field-effect transistor, the second junction field-effect transistor having a source, a drain, a gate, and a channel region, wherein the step of introducing an impurity into first selected regions in the first part of the substrate and into a second selected region (51) in the JFET well region forms the gate of the first junction field effect transistor (7), and the step additionally includes introducing an impurity into a ninth selected region (35) and a tenth selected region (37) in the first part of the substrate to form the source and the drain, respectively, of the second junction field-effect transistor (5), such that the ninth selected region and the tenth selected region are of the second conductivity type;

the step of introducing an impurity into a third selected region (50) in the JFET well region to form the channel region of the junction field-effect transistor forms the channel region of the first junction field effect, and the step additionally comprises the step of introducing an impurity into an eleventh selected region (19) in the first part of the substrate, substantially bounded by the tenth selected region, to form the channel region of the second junction field-effect transistor, such that the eleventh selected region is of the second conductivity type; and the step of introducing an impurity into fourth selected regions in the MOS channel well region, and into a fifth selected region (55) and a sixth selected region (57) in the third selected region in the vJFET well region forms the source and drain, respectively, of the first junction field-effect transistor, and the step additionally includes introducing an impurity into a twelfth selected region (43) between the ninth selected region and the tenth selected region to form the gate of the second junction field-effect transistor, such that the twelfth selected region is of the first conductivity type.

15. The method of claim 14, wherein
in the step of introducing an impurity into an MOS channel well region in the second part of the substrate and into a JFET well region in the second part of the substrate, the impurity is introduced into a first MOS channel well region (13), the method additionally comprises introducing an impurity into a second MOS channel well region (14) in the first part of the substrate to form the channel region of the second metal-oxide-semiconductor transistor, such that the second MOS channel well region is of the first conductivity type; and in the step of introducing an impurity into first selected regions in the first part of the substrate, into a second selected region in the JFET well region, and into a ninth selected region and a tenth selected region in the first part of the substrate, the impurity is introduced into the first selected regions in the second MOS channel well region to form the source and drain of the second MOS transistor.

16. The method of claims 7, 8, 14, or 15, wherein the semiconductor material is silicon.

17. A method of fabricating elements of a junction field-effect transistor having a source, a drain, a gate, and a channel region, while simultaneously fabricating the elements of a first metal-oxide-semiconductor transistor, a second metal-oxide-semiconductor transistor having a channel conductivity of the opposite type to the first metal-oxide-semiconductor transistor, the metal-oxide-semiconductor transistors each having a source, a drain, a gate, and a channel region, and a bipolar transistor having a collector, a base, and an emitter, the method comprising the steps of:

(a) providing a substrate (67) of a semiconductor material having a conductivity of a first type and including:
  (i) a surface (69),
  (ii) a buried layer (73) of the first conductivity type formed therein below the surface, and
  (iii) a buried layer (71) of a second conductivity type, opposite to the first conductivity type, formed therein below the surface;

(b) introducing an impurity into a collector well region (79) of the substrate above the buried layer of the second conductivity type to form the collector of the bipolar transistor (65), into a first MOS channel well region (81) of the substrate to form the channel region of the first metal-oxide-semiconductor transistor (61), and into a JFET well region (113) of the substrate above the buried layer of the first conductivity type to form the channel region of the junction field-effect transistor (111), such that the collector well region, the first MOS channel well region, and the JFET well region are of the second conductivity type;

(c) introducing an impurity into a second MOS channel well region (85) of the substrate to form the channel region of the second metal-oxide-semiconductor transistor (63), and into a first selected region (86) within the collector well region to form the base of the bipolar transistor, such that the second MOS channel well region and the first selected region are of the first conductivity type;

(d) introducing an impurity into a second selected region (117) and into a third selected region (119) in the JFET well region to form the source and drain, respectively, of the junction field-effect transistor, into fourth selected regions (97, 99) in the second MOS channel well region to form the source and drain of the second metal-oxide-semiconductor transistor, and into a fifth selected region (101) within the first selected region to form the emitter of the bipolar transistor, such that the second selected region, the third selected region, the fourth selected regions, and the fifth selected region are of the second conductivity type; and (e) introducing an impurity into sixth selected regions (105, 107) in the first MOS channel well region to form the source and drain of the first metal-oxide-semiconductor transistor, and into a seventh selected region (121) between the second selected region and the third selected region to form the gate of the junction field-effect transistor, such that the sixth selected regions and the seventh selected region are of the first conductivity type.

18. The method of claim 17, wherein
the substrate (67) has a conductivity,
the channel region (113) of the junction field effect transistor has a conductivity, the conductivity of the channel region being about one hundred times greater than the conductivity of the substrate, and
the gate (121) of the junction field effect transistor has a conductivity, the conductivity of the gate being about one hundred times greater than the conductivity of the channel region.

19. The method of claim 17, wherein the first MOS transistor (61) is a P-channel MOS transistor, the second MOS transistor (63) is an N-channel MOS transistor, the bipolar transistor (65) is an NPN bipolar transistor, and the junction field effect transistor (111) is an N-channel junction field effect transistor.

20. The method of claim 17, wherein the step of introducing an impurity into sixth selected regions and into a seventh selected region additionally includes introducing an impurity into an eighth selected region (123) surrounding the seventh selected region to form a substrate contact, such that the eighth selected region is of the first conductivity type.

21. The method of claim 17, wherein the method is for making the elements of a first bipolar transistor, and the method is additionally for making the elements of a second bipolar transistor having an opposite polarity to the first bipolar transistor, and having a collector, a base, and an emitter, wherein:

in the step of introducing an impurity into the collector well region of the substrate, into the first MOS channel well region of the substrate, and into the JFET well region, the impurity is introduced into a first collector well region (79) to form the collector of the first bipolar transistor, the step of introducing an impurity into a second MOS channel well region of the substrate and into a first selected region forms the base (86) of the first bipolar transistor, and the step additionally includes introducing the impurity into a second collector well region (83), above the buried layer of the first conductivity tape, to form the collector of the second bipolar transistor, such that the second collector well region is of the first conductivity type;

the step of introducing an impurity into a second selected region and into a third selected region in the JFET well region, into fourth selected regions in the second MOS channel well region, and into a fifth selected region within the first selected region forms the emitter (101) of the first bipolar transistor, and the step additionally includes introducing the impurity into a ninth selected region (103) in the second collector well region to form the base of the second bipolar transistor, such that the ninth selected region is of the second conductivity type; and the step of introducing an impurity into sixth selected regions, and into a seventh selected region additionally includes introducing the impurity into a tenth selected region (109) in the ninth selected region to form the emitter of the second bipolar transistor, such that the tenth selected region is of the first conductivity type.

22. The method of claim 17, wherein the method is for making the elements of a first junction field-effect transistor, and the method is additionally for making the elements of a second junction field-effect transistor having the opposite polarity to the first junction field effect transistor, and having a source, a drain, a top gate, a back gate, and a channel region, wherein:

in the step of providing a substrate of a semiconductor material, the buried layer of the second conductivity type is a first buried layer (71) of the second conductivity type, and the substrate additionally includes a second buried layer (129) of the second conductivity type formed therein below the surface;

in the step of introducing an impurity into the collector well region of the substrate, into the first MOS channel well region of the substrate, and into the JFET well region of the substrate, the impurity is introduced into a first JFET well region to form the channel region (113) of the first junction field effect transistor (111), the step of introducing an impurity into the second MOS channel well region of the substrate and into a first selected region within the collector well region additionally includes introducing the impurity into a second JFET well region (133) above the second buried layer of the second conductivity type to form the channel region of the second junction field-effect transistor (127), such that the second JFET well region is of the first conductivity type, the step of introducing an impurity into a second selected region and into a third selected region in the first JFET well region, into fourth selected regions in the second MOS channel well region, and into a fifth selected region forms the source and drain, respectively, of the first junction field-effect transistor, and the step additionally includes introducing an impurity into an eleventh selected region (137) in the second JFET well region (133) to form the gate of the second junction field-effect transistor, such that the eleventh selected region is of the second conductivity type;

the step of introducing an impurity into sixth selected regions in the first MOS channel well region, and into a seventh selected region between the second selected region and the third selected region forms the gate of the first junction field-effect transistor, and the step additionally includes introducing the impurity into a twelfth selected region (141) and a thirteenth selected region (143) adjacent to the eleventh selected region to form the source and drain, respectively, of the second junction field-effect transistor, such that the twelfth selected region and the thirteenth region are of the first conductivity type.

23. The method of claims 17, 21, or 22, wherein the semiconductor material is silicon.

24. The method of claims 17, 21, or 22, wherein, in the step of providing a substrate of a semiconductor material, the substrate includes an additional buried layer (72) of the second conductivity type formed therein below the surface, the first MOS channel well (81) is formed above the additional buried layer of the second conductivity type, and the second MOS channel well (85) is formed above the buried layer (73) of the first conductivity type.

25. A method of fabricating elements of a junction field-effect transistor having a source, a drain, a top gate, a back gate, and a channel region, while simultaneously fabricating the elements of a first metal-oxide-semiconductor transistor, a second metal-oxide-semiconductor transistor having a channel conductivity of the opposite type to the first metal-oxide-semiconductor transistor, the metal-oxide-semiconductor transistors each having a source, a drain, a gate, and a channel region, and a bipolar transistor having a collector, a base, and an emitter, the method comprising the steps of:
(a) providing a substrate (67) of a semiconductor material having a conductivity of a first type and including:
  (i) a surface (69),
  (ii) a first buried layer (71) of a second conductivity type, opposite to the first conductivity type, formed therein below the surface,
  (iii) a second buried layer of the second conductivity type (129), formed therein below the surface, at least part of the second buried layer forming the back gate of the junction field-effect transistor (127),
  (4) above the first buried layer of the second conductivity type, a collector well region (79) of the second conductivity type forming the collector of the bipolar transistor (65), and
  (5) a first MOS channel well region (81) of the second conductivity type forming the channel region of the first metal-oxide-semiconductor transistor (61);
(b) introducing an impurity into a JFET well region (133) of the substrate above the second buried layer of the second conductivity type to form the channel region of the junction field-effect transistor, into a second MOS channel well region (85) of the substrate to form the channel region of the second metal-oxide-semiconductor transistor (63), and into a first selected region (86) within the collector well region to form the base of the junction transistor, such that the JFET well region, the second MOS channel well region, and the first selected region are of the first conductivity type;
(c) introducing an impurity into a second selected region (137) in the JFET well region to form the top gate of the junction field-effect transistor, into third selected regions (97, 99) in the second MOS channel well region to form the source and drain of the second metal-oxide-semiconductor transistor, and into a fourth selected region (101) within the first selected region to form the emitter of the bipolar transistor, such that the second selected region, the third selected regions, and the fourth selected region are of the second conductivity type; and
(d) introducing an impurity into fifth selected regions (105, 107) in the first MOS channel well region to form the source and drain of the first metal-oxide-semiconductor transistor, and into a sixth selected region (141) and a seventh selected region (143) adjacent to the second selected region to form the source and drain, respectively, of the junction field-effect transistor, such that the fifth selected regions, the sixth selected region, and the seventh selected region are of the first conductivity type.

26. The method of claim 25, wherein
the substrate (67) has a conductivity,
the channel region (133) of the junction field effect transistor has a conductivity, the conductivity of the channel region being about one hundred time greater than the conductivity of the substrate, and
the gate (137) of the junction field effect transistor has a conductivity, the conductivity of the gate being about one hundred times greater than the conductivity of the channel region.

27. The method of claim 25, wherein the first MOS transistor (61) is a P-channel MOS transistor, the second MOS transistor (63) is an N-channel MOS transistor, the bipolar transistor (65) is an NPN transistor, and the junction field effect transistor (127) is a P-channel junction field effect transistor.

28. The method of claim 25, wherein the step of introducing an impurity into a second selected region, into third selected regions, and into a fourth selected region additionally includes introducing the impurity into an eighth selected region (139) outside the second selected region to form a back gate contact, such that the eighth selected region is of the second conductivity type.

29. The method of claim 25, wherein
in the step of providing a substrate of a semiconductor material, the substrate includes an isolation ring (131) of the second conductivity type above and making contact with the second buried layer (129) of the second conductivity type, and
in the step of introducing an impurity into the JFET well region of the substrate, the JFET well region is substantially bounded by the isolation ring.

30. The method of claim 29, wherein the step of introducing an impurity into a second selected region, into third selected regions, and into a fourth selected region additionally includes introducing the impurity onto an eighth selected region (139) within the isolation ring to form a back gate contact, such that the ninth selected region is of the second conductivity type.

31. The method of claim 25, wherein the step of introducing an impurity into fifth selected regions and into a sixth selected region and a seventh selected region additionally includes introducing the impurity into a ninth selected region (145) in the substrate outside the seventh selected region to provide a substrate contact, such that the ninth selected region is of the first conductivity type.

32. The method of claim 25, wherein the method is for making the elements of a first bipolar transistor, and the method is additionally for making the elements of a second bipolar transistor having an opposite polarity to the first bipolar transistor, and having a collector, a base, and an emitter, and wherein
in the step of providing a substrate of a semiconductor material the substrate includes a buried layer of the first conductivity type formed therein below the surface, and the collector well region is a first collector well region (79) forming the collector of the first bipolar transistor (65),
the step of introducing an impurity into the JFET well region of the substrate, into the second MOS channel well region of the substrate, and into a first selected region within the first collector well region forms the base (86) of the first bipolar transistor, and the step additionally includes introducing the impurity into a second collector well region (83) in the substrate to form the collector of the second bipolar transistor (66), such that the second collector well region is of the first conductivity type,
the step of introducing an impurity into a second selected region in the JFET well region, into third selected regions in the second MOS channel well region, and into a fourth selected region within the first selected region forms the emitter (101) of the first bipolar transistor, and the step additionally includes introducing an impurity into a tenth selected region (103) in the second collector well region to form the base of the second bipolar transistor, such that the tenth selected region is of the second conductivity type;

the step of introducing an impurity into fifth selected regions in the first MOS channel well region, and into a sixth selected region and a seventh selected region additionally includes introducing the impurity into an eleventh selected region to form the emitter (109) of the second bipolar transistor, such that the eleventh selected region is of the first conductivity type.

33. The method of claim 25, wherein, in the step of providing a substrate of a semiconductor material, the substrate includes a buried layer (73) of the first conductivity type formed therein below the surface; and an additional buried layer (72) of the second conductivity type formed therein below the surface, the first MOS channel well (81) is formed above the additional buried layer of the second conductivity type the second MOS channel well is formed above the buried layer of the first conductivity type.

34. The method of claims 25 or 32, wherein the semiconductor material is silicon.

* * * * *